(12) United States Patent
Hasegawa et al.

(10) Patent No.: US 12,370,575 B2
(45) Date of Patent: Jul. 29, 2025

(54) ELECTROSTATIC TRANSDUCER AND ELECTROSTATIC TRANSDUCER UNIT

(71) Applicant: Sumitomo Riko Company Limited, Aichi (JP)

(72) Inventors: Koichi Hasegawa, Aichi (JP); Shinya Tahara, Aichi (JP); Katsuhiko Nakano, Aichi (JP); Masaki Nasu, Aichi (JP)

(73) Assignee: Sumitomo Riko Company Limited, Aichi (JP)

( * ) Notice: Subject to any disclaimer, the term of this patent is extended or adjusted under 35 U.S.C. 154(b) by 560 days.

(21) Appl. No.: 17/341,402

(22) Filed: Jun. 8, 2021

(65) Prior Publication Data

US 2021/0291229 A1 Sep. 23, 2021

Related U.S. Application Data

(63) Continuation of application No. PCT/JP2020/014159, filed on Mar. 27, 2020.

(30) Foreign Application Priority Data

Apr. 26, 2019 (JP) ................................. 2019-085574

(51) Int. Cl.
*B06B 1/02* (2006.01)
(52) U.S. Cl.
CPC ................................. *B06B 1/0292* (2013.01)

(58) Field of Classification Search
None
See application file for complete search history.

(56) References Cited

U.S. PATENT DOCUMENTS

2004/0004486 A1\* 1/2004 Poulbot ................. G01L 19/069
324/660
2005/0215915 A1 9/2005 Noda et al.
(Continued)

FOREIGN PATENT DOCUMENTS

CN 104067099 9/2014
EP 1848046 10/2007
(Continued)

OTHER PUBLICATIONS

Seko Takaaki; Apparatus for Detecting Driver's Letting Go of Steering Wheel; Publication Date :Oct. 6, 2014; Nidec Elesys Corp; JP2014190856A; (Year: 2014).\*
(Continued)

*Primary Examiner* — Nasima Monsur
(74) *Attorney, Agent, or Firm* — JCIPRNET

(57) ABSTRACT

An electrostatic transducer that enables improvement of detection accuracy or driving precision while allowing flexibility is provided. The electrostatic transducer (1) is provided with: an insulator sheet (11); at least one electrode sheet (12) which is laminated on the insulator sheet (11), constitutes a target region to be used as a detection region or a driving region, is formed of an elastomer comprising a conductive filler, and includes at least one terminal part
(Continued)

(12b); and at least one bypass conductor (13) which has an electrical resistivity less than that of the electrode sheet (12), is disposed in contact with the electrode sheet (12) along the surface of a part of the electrode sheet (12), and is electrically connected to the electrode sheet (12) in the area in contact with the electrode sheet (12).

8 Claims, 9 Drawing Sheets

(56) References Cited

U.S. PATENT DOCUMENTS

| | | | | |
|---|---|---|---|---|
| 2009/0211818 | A1* | 8/2009 | Kondo | G06F 3/045 |
| | | | | 178/18.03 |
| 2010/0033196 | A1 | 2/2010 | Hayakawa et al. | |
| 2013/0160554 | A1* | 6/2013 | Chen | G01D 5/2417 |
| | | | | 73/632 |
| 2014/0007693 | A1* | 1/2014 | Torashima | B06B 1/0292 |
| | | | | 381/174 |
| 2014/0326079 | A1* | 11/2014 | Maeda | G01L 1/142 |
| | | | | 73/862.626 |
| 2015/0200039 | A1* | 7/2015 | Taguchi | H01B 1/24 |
| | | | | 252/514 |
| 2020/0053482 | A1 | 2/2020 | Nakano et al. | |
| 2020/0213772 | A1 | 7/2020 | Hasegawa et al. | |
| 2020/0307992 | A1 | 10/2020 | Hasegawa et al. | |

FOREIGN PATENT DOCUMENTS

| | | |
|---|---|---|
| EP | 2924695 | 9/2015 |
| JP | H05172839 | 7/1993 |
| JP | 2005315831 | 11/2005 |
| JP | 2014190856 | 10/2014 |
| WO | 2019065960 | 4/2019 |

OTHER PUBLICATIONS

"Office Action of China Counterpart Application", issued on Jul. 28, 2022, with English translation thereof, p. 1-p. 27.

"International Search Report (Form PCT/ISA/210) of PCT/JP2020/014159," mailed on Jun. 23, 2020, with English translation thereof, pp. 1-4.

"Search Report of Europe Counterpart Application", issued on Jul. 14, 2022, p. 1-p. 14.

* cited by examiner

ELECTROSTATIC TRANSDUCER AND ELECTROSTATIC TRANSDUCER UNIT

CROSS-REFERENCE TO RELATED APPLICATION

This application is a continuation application of International Application number PCT/JP2020/014159 on Mar. 27, 2020, which claims the priority benefit of Japan Patent Application No. 2019-085574, filed on Apr. 26, 2019. The entirety of each of the above-mentioned patent applications is hereby incorporated by reference herein and made a part of this specification.

BACKGROUND

Technical Field

The present disclosure relates to an electrostatic transducer and an electrostatic transducer unit.

Related Art

Japanese Patent Laid-Open No. 2005-315831 discloses an electrostatic sensor used in a device configured to measure a heart rate or a respiration rate of a human body and including conductive fabrics and a dielectric substance. Japanese Patent Laid-Open No. 2014-190856 discloses an electrostatic sensor applied to a steering wheel and configured to detect a driver's release state. In addition, Japanese Patent Laid-Open No. 1105-172839 discloses a piezoelectric sensor in which electrodes provided on both surfaces of a piezoelectric film are mesh-shaped and the output voltage is controlled by changing a degree of meshes.

Incidentally, in a case in which a shape of an attachment object of an electrostatic transducer (such as a sensor or an actuator) is a three-dimensional shape (such as a three-dimensional curved surface or a composite plane), in view of an attachment property, flexibility is required for the electrostatic transducer. That is, the electrostatic transducer needs to be able to be attached to the attachment object while being deformed.

In recent years, electrode sheets formed by elastomers containing conductive fillers have been developed. However, in the elastomers containing the conductive fillers, the electrode sheets become harder as a blending ratio of the conductive fillers is increased, and the electrode sheets become softer but electrical resistivity is increased as the blending ratio of the conductive fillers is decreased.

Here, in order to satisfy the above-mentioned requirements, in the case in which the elastomers containing the conductive fillers are used as the electrode sheet, it is necessary to set the blending ratio such that the conductive fillers have a desired electrical resistivity while having a desired flexibility.

However, in the electrostatic sensor in which the elastomers containing the conductive fillers are used in the electrode sheet, when one detection region is wide, measurement accuracy decreases depending on the position in the detection region due to an influence of the electrical resistance of the electrode sheet. Similarly, in the electrostatic actuator, when one driving region is wide, driving accuracy decreases depending on the position of the one driving region due to an influence of the electrical resistance of the electrode sheet.

The present disclosure is directed to providing an electrostatic transducer capable of improving detection accuracy or driving accuracy while having flexibility. Further, the present disclosure is directed to providing a unit including the electrostatic transducer.

SUMMARY (1. First Electrostatic Transducer)

A first electrostatic transducer includes an insulator sheet; at least one electrode sheet laminated on the insulator sheet, constituting one target region as a detection region or a driving region, formed of an elastomer containing conductive fillers, and including at least one terminal part; and at least one bypass conductor having an electrical resistivity smaller than an electrical resistivity of the electrode sheet, disposed in contact with the electrode sheet along a surface of a portion of the electrode sheet, and electrically connected to the electrode sheet in an area in contact with the electrode sheet.

Since the electrode sheet is formed of an elastomer containing conductive fillers, flexibility higher than that of a metal sheet or conductive fabrics is provided. Accordingly, when the electrostatic transducer is attached to an attachment object, an attachment property is improved.

However, since the electrode sheet is formed of an elastomer containing conductive fillers, an electrical resistivity is increased compared to a metal sheet or conductive fabrics. However, the above-mentioned electrostatic transducer includes a bypass conductor. A substantial electrical resistivity between the terminal part and a position far from the terminal part is reduced by the bypass conductor. Accordingly, detection accuracy as an electrostatic sensor or driving accuracy as an electrostatic actuator can be improved.

Even when the bypass conductor is formed of a harder material than the electrode sheet, since the bypass conductor is disposed in a portion of the electrode sheet, an influence on flexibility as the electrostatic transducer is small. Accordingly, the electrostatic transducer has high flexibility.

(2. Second Electrostatic Transducer)

A second electrostatic transducer includes an insulator sheet; an electrode sheet laminated on the insulator sheet, constituting one target region as a detection region or a driving region, formed of an elastomer containing conductive fillers, and including a plurality of terminal parts; a plurality of terminal connection wiring parts having one ends electrically connected to each of the plurality of terminal parts and the other ends electrically connected to each other; and a coupling wiring part constituting one input/output end from a connecting position of the other ends of the plurality of terminal connection wiring parts.

Since the electrode sheet is formed of an elastomer containing conductive fillers, flexibility is increased compared to the metal sheet or conductive fabrics. Accordingly, when the electrostatic transducer is attached to the attachment object, an attachment property is improved.

However, since the electrode sheet is formed of an elastomer containing conductive fillers, an electrical resistivity is increased compared to a metal sheet or conductive fabrics. However, the electrode sheet constituting the above-mentioned electrostatic transducer constitutes one target region and includes a plurality of terminal parts. The plurality of terminal parts are each electrically connected to the corresponding terminal connection wiring parts, and the plurality of terminal connection wiring parts are electrically connected to a coupling wiring part that constitutes one input/output end. That is, the electrode sheet constituting the one target region is electrically connected to one coupling wiring part via the plurality of terminal parts and the plurality of terminal connection wiring parts. In this way, the one target region is connected to one coupling wiring part by the plurality of routes.

Accordingly, even when an arbitrary position is a position far from a certain terminal part, the terminal part can be disposed at a position close to another terminal part. Then, at the arbitrary position, detection accuracy as the electrostatic sensor and driving accuracy as the electrostatic actuator depend on the electrical resistance between the arbitrary position and any one terminal part of the plurality of terminal parts. That is, a difference in electrical resistance according to the position can be reduced. As a result, detection accuracy and driving accuracy can be improved.

(3. Electrostatic Transducer Unit)

An electrostatic transducer unit includes a core member having a centerline; an electrostatic transducer that is the above-mentioned electrostatic transducer, having a back surface disposed along an outer circumferential surface of the core member to face an outer circumferential surface of the core member about the centerline; and a resin inner layer member interposed between the outer circumferential surface of the core member and the back surface of the electrostatic transducer and fixed to the core member and the electrostatic transducer, wherein end sides of the electrostatic transducer in a circumferential direction of the outer circumferential surface of the core member are defined as first end sides, the two first end sides of the electrostatic transducer are disposed to face each other with a distance in a circumferential direction of the outer circumferential surface of the core member, and the resin inner layer member is interposed in a gap between the two first end sides.

When the electrostatic transducer is disposed along the outer circumferential surface of the core member, the resin inner layer member is disposed between the outer circumferential surface of the core member and the back surface of the electrostatic transducer, and the resin inner layer member is fixed to the outer circumferential surface of the core member and the back surface of the electrostatic transducer. Accordingly, the electrostatic transducer can be prevented from peeling off from the core member. Then, since the electrostatic transducer can be neatly arranged on the outer circumferential surface of the core member, design properties of the electrostatic transducer unit are improved. Further, the electrostatic transducer unit is easily manufactured by applying the resin inner layer member.

DESCRIPTION OF EMBODIMENTS

1. Application Target of Electrostatic Transducer

Figure 1:
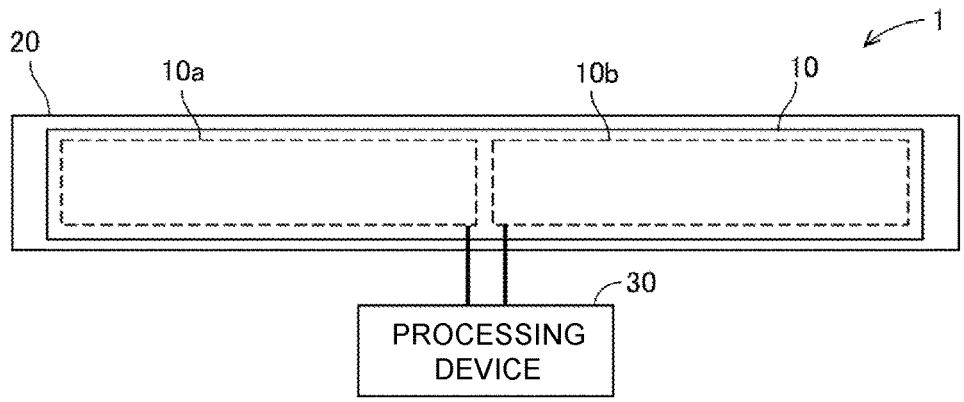
FIG. 1 is a view showing a configuration of a transducer as a whole.

An electrostatic transducer (hereinafter referred to as "a transducer") includes, for example, a base member, and an electrostatic sheet attached to an attachment surface of the base member. The base member is an arbitrary member and formed of a metal, a resin, or another material.

In addition, the attachment surface of the base member may be formed in a three-dimensional shape such as a composite shape of a curved surface, a composite plane, a planar surface or a curved surface, or a surface of the base member may be formed in a single planar surface. When the base member is formed of a material having flexibility, the electrostatic sheet can also be attached to the attachment surface of the base member. In addition, the transducer can also be used as the electrostatic sheet, which is a single body, without including the base member.

The electrostatic sheet can function as an actuator configured to generate vibration, sound, or the like, using a variation in electrostatic capacity between a pair of electrodes. In addition, the electrostatic sheet can function as a sensor configured to detect a pressing force or the like from the outside and a sensor configured to detect contact or an approach of an electric conductor having a potential using a variation in electrostatic capacity between the electrodes.

When the electrostatic sheet functions as an actuator, the insulator is deformed according to a potential between the pair of electrodes by applying a voltage to the pair of electrodes, and vibration is generated according to deformation of the insulator. When the electrostatic sheet functions as a pressing force detecting sensor, the electrostatic capacity between the pair of electrodes is varied by deforming the insulator due to input of a pressing force, vibration, sound, or the like, from the outside, and the pressing force or the like from the outside is detected by detecting a voltage according to the electrostatic capacity between the pair of electrodes.

In addition, when the electrostatic sheet functions as a proximity contact sensor, an electrostatic capacity between the electrode and the electric conductor is varied according to contact or an approach of the electric conductor having a potential, and the contact or approach of the electric conductor is detected by detecting the voltage according to the varied electrostatic capacity between the electrodes. In addition, when the electrostatic sheet functions as a proximity contact sensor, in addition to this, the electrostatic capacity between the pair of electrodes is varied according to the contact or approach of the electric conductor having a potential, and the contact or approach of the electric conductor can also be detected by detecting the voltage according to the varied electrostatic capacity between the pair of electrodes.

The transducer can be applied to, for example, a surface of a pointing device such as a mouse or a joystick, a surface of a vehicle part, or the like. Vehicle parts include an armrest, a door knob, a shift lever, a steering wheel, a door trim, a center trim, a center console, a ceiling, and the like. In many cases, the base member is formed of a material with no flexibility such as a metal, a hard resin, or the like. In this case, the transducer can detect a state of an object person or give vibration or the like to the object person.

In addition, the transducer may be disposed on the side of the surface layer of the sheet bearing surface. In this case, the transducer may be configured to attach the electrostatic sheet to the base member formed of a material with flexibility such as a resin film or the like. In addition, the transducer may be constituted by a single electrostatic sheet without including the base member.

In addition, the electrostatic sheet of the transducer can also be configured to have a heater function. In this case, the transducer can perform application of heat to the object person, in addition to detecting the state of the object person or applying vibration or the like to the object person.

2. Entire Configuration of Transducer

The entire configuration of an example of a transducer 1 will be described with reference to FIG. 1. The transducer 1 includes at least an electrostatic sheet 10 and a processing device 30. In FIG. 1, the case in which the transducer 1 further includes an elongated base member 20 will be exemplarily described. However, the transducer 1 may have a configuration with no base member 20. Further, hereinafter, the unit of the electrostatic sheet 10 and the base member 20 is referred to as a transducer main body.

The example in which the base member 20 is formed in an elongated shape is exemplarily described with reference to FIG. 1. A shape of the base member 20 may be an arbitrary shape as described above. The base member 20 is formed of an arbitrary material such as a metal, a resin, or the like.

The electrostatic sheet 10 is disposed on the attachment surface of the base member 20. The electrostatic sheet 10 is elastically deformable as a whole and has flexibility. The electrostatic sheet 10 is mainly formed of an elastomer. Then, even when the attachment surface of the base member 20 is a three-dimensional curved surface, the electrostatic sheet 10 can be attached along the curved attachment surface of the base member 20. In particular, it is possible to suppress occurrence of wrinkles of the electrostatic sheet 10 by attaching the electrostatic sheet 10 to the attachment surface of the base member 20 while extending in a surface direction.

The electrostatic sheet 10 includes at least one of target regions 10a and 10b. In FIG. 1, the electrostatic sheet 10 includes the two target regions 10a and 10b. Here, the first target region 10a functions as one detection region when the transducer 1 is a sensor and functions as one driving region when the transducer 1 is an actuator. The second target region 10b is the same as the first target region 10a.

The electrostatic sheet 10 is formed in an elongated shape to correspond to the base member 20. Further, the plurality of target regions 10a and 10b are arranged side by side in a longitudinal direction of the base member 20. In addition, a shape of each of the target regions 10a and 10b is formed in an elongated shape in which the longitudinal direction of the base member 20 is referred to as a longitudinal direction. Further, the electrostatic sheet 10 may be disposed to be divided in a widthwise direction (a short direction) of the base member 20, or may be disposed to be divided in a longitudinal direction and a widthwise direction of the base member 20. The shape of the electrostatic sheet 10 may be an arbitrary shape as appropriate.

In the case in which the transducer 1 is a sensor, the processing device 30 acquires a voltage or a current from the electrostatic sheet 10 when electric power is supplied to the electrostatic sheet 10, and detects and calculates target operation on the basis of the acquired voltage or current. In addition, in the case in which the transducer 1 is an actuator, the processing device 30 calculates the electric power supplied to drive the electrostatic sheet 10, and supplies the calculated electric power to the electrostatic sheet 10.

3. Specific Configuration of Transducer 1 of First Example

Figure 2:
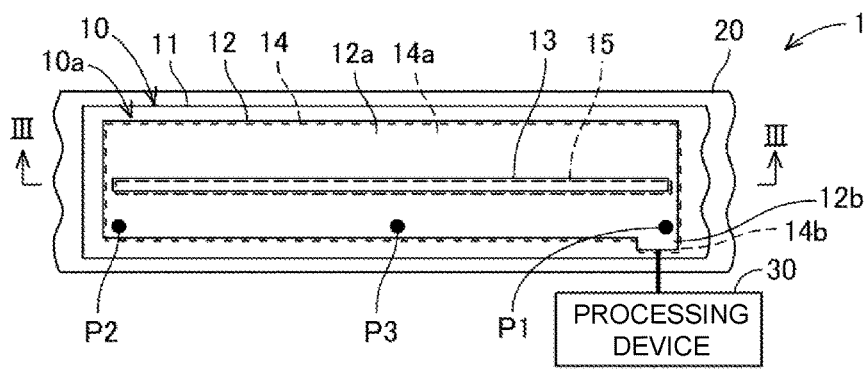
FIG. 2 is a configuration view of a portion of a transducer of a first example related to one target region.

A specific configuration of the transducer 1 of the first example will be described with reference to FIGS. 2 and 3. The transducer 1 includes the electrostatic sheet 10, the base member 20 and the processing device 30.

The electrostatic sheet 10 includes, at least, an insulator sheet 11, a first electrode sheet 12 and a first bypass conductor 13. In FIGS. 2 and 3, a case in which the electrostatic sheet 10 further includes a second electrode sheet 14 and a second bypass conductor 15 is exemplified. However, the electrostatic sheet 10 may be configured not to include the second electrode sheet 14 and the second bypass conductor 15.

The insulator sheet 11 is formed of an elastomer. Accordingly, the insulator sheet 11 is elastically deformable. The insulator sheet 11 is formed of, for example, a thermoplastic elastomer. The insulator sheet 11 may be formed of a thermoplastic elastomer itself, or may be formed by the elastomer crosslinked by heating the thermoplastic elastomer as a material.

Here, the insulator sheet 11 may be formed of one or more selected from styrene-based, olefin-based, vinyl chloride-based, urethane-based, ester-based, and amide-based elastomers. For example, as the styrene-based elastomer, SBS, SEBS, SEPS, or the like, is exemplified. As the olefin-based elastomer, in addition to EEA, EMA, EMMA, or the like, a copolymer (ethylene-octene copolymer) of ethylene and a olefin or the like is exemplified.

The insulator sheet 11 may include a rubber and a resin, in addition to the thermoplastic elastomer. For example, when a rubber such as an ethylene-propylene rubber (EPM, EPDM) or the like is included, flexibility of the insulator sheet 11 is improved. In view of improvement in flexibility of the insulator sheet 11, the insulator sheet may contain a flexibility-adding element such as a plasticizer or the like.

Figure 3:
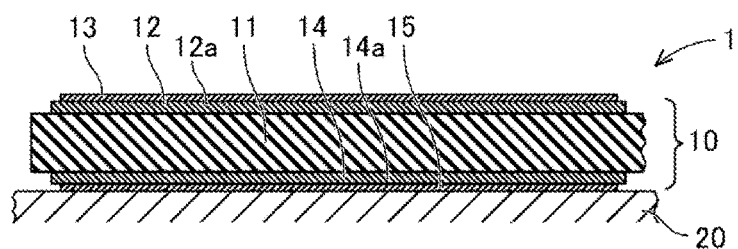
FIG. 3 is a longitudinal cross-sectional view along line III-III in FIG. 2 showing portions of an electrostatic sheet and a base member that constitute the transducer of the first example.

The first electrode sheet 12 is laminated on a surface of the insulator sheet 11 (an upper surface of FIG. 3). In addition, the first electrode sheet 12 has flexibility and elasticity in the surface direction while having conductivity. The first electrode sheet 12 is formed of a conductive elastomer. That is, the first electrode sheet 12 is formed of an elastomer containing conductive fillers.

The elastomer used in the first electrode sheet 12 may be formed of a material having the same main component as the insulator sheet 11. That is, the first electrode sheet 12 may be formed of one or more selected from styrene-based, olefin-based, vinyl chloride-based, urethane-based, ester-based, and amide-based elastomers. For example, as the styrene-based elastomer, SBS, SEBS, SEPS, or the like, is exemplified. As the olefin-based elastomer, in addition to EEA, EMA, EMMA, or the like, a copolymer (ethylene-octene copolymer) of ethylene and a olefin or the like is exemplified.

However, the first electrode sheet 12 is designed to have a higher softening point than the insulator sheet 11. This is because the insulator sheet 11 can be softened before the first electrode sheet 12 when the first electrode sheet 12 is fixed to the insulator sheet 11 through fusion (for example, heat fusion) of the insulator sheet 11 itself.

The one first electrode sheet 12 constitutes the one target region 10a shown in FIG. 1. Further, another first electrode sheet 12 constitutes the target region 10b. Specifically, the first electrode sheet 12 includes one first electrode sheet main body 12a, and one terminal part 12b. The first electrode sheet main body 12a is formed in a shape that coincides with the one target region 10a. Accordingly, the first electrode sheet main body 12a is formed in an elongated shape.

The one terminal part 12b is disposed on a first end portion (a right end of FIG. 2) of the first electrode sheet main body 12a in the longitudinal direction. The terminal part 12b is an area electrically connected to the processing device 30. The terminal part 12b and the processing device 30 are electrically connected by a wiring formed on the insulator sheet 11 and a wiring provided in the outside of the insulator sheet 11. Here, in FIG. 2, while the terminal part 12b is an area protruding outward from the first electrode sheet main body 12a, the terminal part 12b may be a circumferential edge of the first electrode sheet main body 12a.

The first electrode sheet 12 is fixed to the insulator sheet 11 through fusion (for example, heat fusion) of the insulator sheet 11 itself. Further, the first electrode sheet 12 and the insulator sheet 11 are fixed through fusion (for example, heat fusion) of the first electrode sheet 12 itself. That is, the first electrode sheet 12 and the insulator sheet 11 are fixed to each other through fusion.

The first bypass conductor 13 has an electrical resistivity smaller than an electrical resistivity of the first electrode sheet 12. In particular, the electrical resistivity of the first bypass conductor 13 is effective when it is equal to or smaller than 1/10 of the electrical resistivity of the first electrode sheet 12.

Further, the first bypass conductor 13 is disposed to face a portion of the first electrode sheet 12 while being in contact with the first electrode sheet 12. In particular, the first bypass conductor 13 is formed in an elongated shape. The first bypass conductor 13 is disposed in the longitudinal direction of the first electrode sheet 12. The elongated shape disclosed herein is not limited to a linear shape but may have a length.

In addition, the first bypass conductor 13 is disposed from a first end portion (a right end of FIG. 2) of the first electrode sheet 12 in the longitudinal direction to a second end portion (a left end of FIG. 2) opposite to the first end portion. That is, the first end portion of the first bypass conductor 13 in the longitudinal direction is disposed on the side of the terminal part 12b in the elongated shape of the first electrode sheet 12. Meanwhile, the second end portion of the first bypass conductor 13 in the longitudinal direction is disposed at a side opposite to the terminal part 12b in the elongated shape of the first electrode sheet 12.

Further, the first bypass conductor 13 is electrically connected to the first electrode sheet 12 in the area in contact with the first electrode sheet 12. Here, the first bypass conductor 13 may be laminated on a front surface or a back surface of the first electrode sheet 12 or may be buried in the first electrode sheet 12. Further, a specific example of the first bypass conductor 13 will be described below.

The second electrode sheet 14 is laminated on the side of the back surface (a lower surface of FIG. 3) of the insulator sheet 11, i.e., a surface of the insulator sheet 11 opposite to the first electrode sheet 12. That is, the second electrode sheet 14 is disposed between the insulator sheet 11 and the base member 20. The second electrode sheet 14 is formed to be the same as the first electrode sheet 12.

The second bypass conductor 15 has an electrical resistivity smaller than the electrical resistivity of the second electrode sheet 14. The second bypass conductor 15 is disposed along a surface of a portion of the second electrode sheet 14 while being in contact with the second electrode sheet 14. In particular, the second bypass conductor 15 is formed in an elongated shape. The second bypass conductor 15 is disposed in the longitudinal direction of the second electrode sheet 14. The elongated shape disclosed herein is not limited to a linear shape but may have a length.

Further, the second bypass conductor 15 is electrically connected to the second electrode sheet 14 in the area in contact with the second electrode sheet 14. Here, the second bypass conductor 15 may be laminated on the front surface or the back surface of the second electrode sheet 14 or may be buried in the second electrode sheet 14. Further, the second bypass conductor 15 is the same as the first bypass conductor 13.

4. Effects by Transducer 1 of First Example

The first electrode sheet 12 has flexibility higher than a metal sheet or conductive fabrics because the first electrode sheet 12 is formed of an elastomer containing conductive fillers. The second electrode sheet 14 is also the same as above. Accordingly, when the transducer 1 is attached to the attachment object of the base member 20, attachment properties become better.

However, the first electrode sheet 12 has the electrical resistivity higher than that of the metal sheet or conductive fabrics because the First electrode sheet 12 is formed of the elastomer containing conductive fillers. Here, in the first electrode sheet 12 as a single body, an electrical resistivity between the terminal part 12b and a position P1 (shown in FIG. 2) close to the terminal part 12b is small. However, in the first electrode sheet 12 as a single body, an electrical resistivity between the terminal part 12b and a position P2 (shown in FIG. 2) far from the terminal part 12b is large. Naturally, in the first electrode sheet 12 as a single body, an electrical resistivity between the terminal part 12b and a position P3 (shown in FIG. 2) is about intermediate.

However, the transducer 1 includes the first bypass conductor 13. A substantial electrical resistivity between the terminal part 12b of the first electrode sheet 12 and the position P2 far from the terminal part 12b is decreased by the first bypass conductor 13. A substantial electrical resistivity between the terminal part 12b and the position P3 is also small. Accordingly, when the transducer 1 is a sensor, detection accuracy can be improved. In addition, when the transducer 1 is an actuator, driving accuracy can be improved.

Even when the first bypass conductor 13 is formed of a harder material than the first electrode sheet 12, since the first bypass conductor 13 is disposed in a portion of the first electrode sheet 12, a degree of influence on the flexibility as the transducer 1 is small. Accordingly, the transducer has high flexibility. Then, an action by the second electrode sheet 14 and the second bypass conductor 15 is the same as that by the first electrode sheet 12 and the first bypass conductor 13.

5. Specific Example of Bypass Conductor

A specific example of the first bypass conductor 13 will be described. Further, since the second bypass conductor 15 is the same as the first bypass conductor 13, description thereof will be omitted.

5-1. Linear Metal Wire

The first example of the first bypass conductor 13 is constituted by a metal wire. The metal wire is, for example, a copper wire, a nichrome wire, or the like. In this case, the electrical resistivity of the first bypass conductor 13 may be equal to or smaller than $1/10$ of the electrical resistivity of the first electrode sheet 12, further, equal to or smaller than $1/100$.

Further, the first bypass conductor 13 is formed on a central section of the first electrode sheet 12 in the widthwise direction (short direction) in a linear shape parallel to the longitudinal direction of the first electrode sheet 12. The first bypass conductor 13 is fixed to the first electrode sheet 12 through fusion (for example, heat fusion) of the first electrode sheet 12 itself.

When the first bypass conductor 13 is constituted by a metal wire, an effect of making a substantial electrical resistivity smaller is exhibited. Further, when the first bypass conductor 13 is formed in a linear shape, molding and installation of the first bypass conductor 13 become easier.

5-2. Conductive Fabrics

Figure 4:
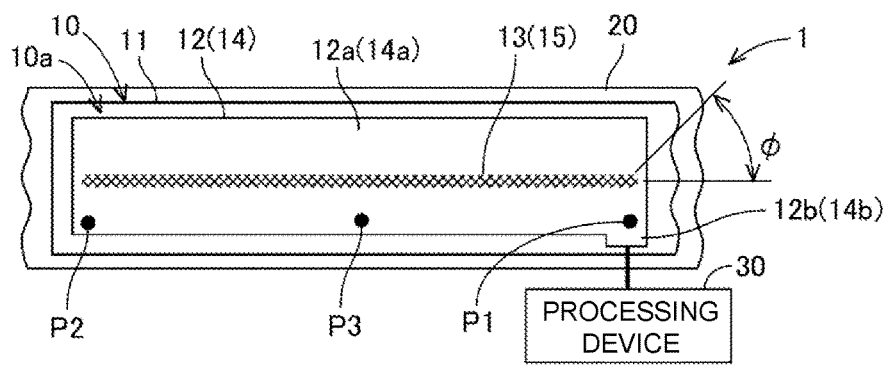
FIG. 4 is a view showing the transducer of the first example and a view showing a second example of a bypass conductor that constitutes the electrostatic sheet.

As shown in FIG. 4, a second example of the first bypass conductor 13 is constituted by conductive fabrics. The conductive fabrics are woven fabrics or non-woven fabrics constituted by conductive fibers. Here, the conductive fiber is formed by coating a surface of the fiber having flexibility with a conductive material. The conductive fiber is formed by plating a surface of a resin fiber such as polyethylene or the like with copper, nickel, or the like. In this case, the electrical resistivity of the first bypass conductor 13 may be equal to or smaller than $1/10$ of the electrical resistivity of the first electrode sheet 12, further, equal to or smaller than $1/100$.

Further, the first bypass conductor 13 is formed on a central section of the first electrode sheet 12 in the widthwise direction (short direction) in a linear shape parallel to the longitudinal direction of the first electrode sheet 12. The first bypass conductor 13 is fixed to the first electrode sheet 12 through fusion (for example, heat fusion) of the first electrode sheet 12 itself.

When the first bypass conductor 13 is constituted by conductive fabrics, an effect of making a substantial electrical resistivity smaller is exhibited. Further, when the first bypass conductor 13 is constituted by conductive fabrics, molding and installation of the first bypass conductor 13 become easier. Further, when the first bypass conductor 13 is constituted by conductive fibers, the first electrode sheet 12 softens and enters a hole of the first bypass conductor 13. Accordingly, the first bypass conductor 13 is more strongly fixed to the first electrode sheet 12.

Further, the first bypass conductor 13 is constituted by conductive fabrics having meshes and formed in a sheet shape, and further, an orientation direction of the meshes is inclined with respect to the longitudinal direction of the first electrode sheet 12 (an angle $\varphi$ in FIG. 4). Accordingly, the first bypass conductor 13 can extend in the longitudinal direction of the first electrode sheet 12. That is, the first bypass conductor 13 can follow extension and deformation of the first electrode sheet 12 when the first electrode sheet 12 extends in the longitudinal direction. As a result, extension performance of the transducer 1 is enhanced. In particular, the orientation direction of the meshes of the first bypass conductor 13 may be included with respect to the longitudinal direction of the first electrode sheet 12 by 45°. Accordingly, extension performance in the longitudinal direction and extension performance in the short direction of the transducer 1 are enhanced.

5-3. Undulated Metal Wire

Figure 5:
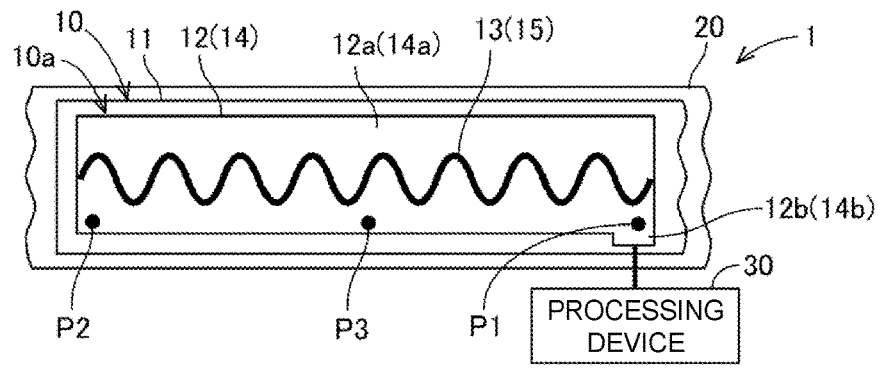
FIG. 5 is a view showing the transducer of the first example and a view showing a third example of the bypass conductor that constitutes the electrostatic sheet.

As shown in FIG. 5, a third example of the first bypass conductor 13 is constituted by metal wires. The metal wire is the same as the first example. Further, the first bypass conductor 13 is formed on the central section of the first electrode sheet 12 in the widthwise direction (short direction) in an undulated shape. Accordingly, a substantial electrical resistivity in an edge of the first electrode sheet 12 in the widthwise direction can be decreased. In addition, the first bypass conductor 13 can extend in the longitudinal direction of the first electrode sheet 12. That is, when the first bypass conductor 13 can follow extension and deformation of the first electrode sheet 12 when the first electrode sheet 12 extends in the longitudinal direction. As a result, extension performance of the transducer 1 is enhanced.

5-4. Mesh-Shaped Metal Wire

A fourth example of the first bypass conductor 13 is formed of a thin punched metal having flexibility and elastic properties. That is, the first bypass conductor 13 is formed in a mesh shape. An orientation direction of the meshes of the first bypass conductor 13 may be inclined with respect to the longitudinal direction of the first electrode sheet 12. In addition, the orientation direction of the meshes of the first bypass conductor 13 may be inclined with respect to the longitudinal direction of the first electrode sheet 12 by 45°. Accordingly, extension performance in the longitudinal direction and extension performance in the short direction of the transducer 1 are enhanced.

5-5. Conductive Elastomer

A fifth example of the first bypass conductor 13 is formed of a conductive elastomer. That is, the first bypass conductor 13 is formed of an elastomer containing conductive fillers. However, the first bypass conductor 13 has an electrical resistivity smaller than that of the first electrode sheet 12. Accordingly, when the same type of conductive filler is applied, the first bypass conductor 13 has a higher proportion of the conductive fillers than that of the first electrode sheet 12. Here, the elastomer applied to the first bypass conductor 13 is preferably applied to the same type of elastomer as that of the first electrode sheet 12.

When the first bypass conductor 13 is formed of an elastomer, flexibility of the transducer 1 as a whole becomes higher. Further, when the elastomer of the first bypass conductor 13 is the same type as that of the first electrode sheet 12, fixing performance therebetween is further increased.

6. Transducer 2 of Second Example

Figure 6:
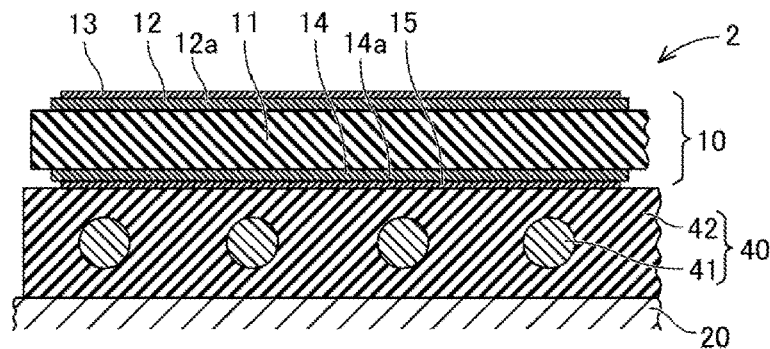
FIG. 6 is a longitudinal cross-sectional view of portions of an electrostatic sheet and a base member of a second example, corresponding to FIG. 3.

A transducer 2 of a second example will be described with reference to FIG. 6. As shown in FIG. 6, the transducer 2 includes the electrostatic sheet 10, the base member 20, a heater sheet 40 disposed between the back surface of the electrostatic sheet 10 and the front surface of the base member 20, and the processing device 30. That is, the transducer 2 has a heater function, in addition to a function of the sensor or the actuator.

Here, the electrostatic sheet 10 in the transducer 1 can be applied to the electrostatic sheet 10. However, the insulator sheet 11 that constitutes the electrostatic sheet 10 may be formed of the following material such that heat of the heater sheet 40 can be transferred to a surface of the electrostatic sheet 10 and a heat resistance is secured.

The thermal conductivity of the insulator sheet 11 is equal to or greater than 0.3 W/m·K. An appropriate thermal conductivity is equal to or greater than 0.4 W/m·K, further, equal to or greater than 0.5 W/m·K. The insulator sheet 11 has a relatively large thermal conductivity, and desirably has an insulating inorganic filler. An appropriate thermal conductivity of the inorganic filler (thermal conductive filler) used to increase the thermal conductivity of the insulator sheet 11 is equal to or greater than 5 W/m·K, preferably equal to or greater than 10 W/m·K, more preferably equal to or greater than 20 W/m·K. As the inorganic filler with a relatively large thermal conductivity, a metal filler, for example, magnesium oxide, aluminum oxide, aluminum nitride, or the like, is exemplified. In addition to the metal filler, boron nitride, silicon carbide, or the like, is also has a relatively large thermal conductivity and may be used as an inorganic filler.

In addition, from a viewpoint that flame retardance is provided in the insulator sheet 11, the insulator sheet 11 preferably has the inorganic filler with flame retardance and insulation. As the flame retardance filler, a hydroxide filler, for example, magnesium hydroxide, aluminum hydroxide, or the like, is exemplified. In addition to the hydroxide filler, boron nitride or the like can also be used as the flame retardance filler. In addition, a flame retardance filler may function as an inorganic filler (thermal conductive filler) used to increase thermal conductivity of the insulator sheet 11.

In addition, from a viewpoint that insulation of the insulator sheet 11 is secured, a volume resistivity of the insulator sheet 11 is equal to or greater than $1 \times 10^{12}$ Ω·cm. An appropriate volume resistivity is equal to or greater than $1 \times 10^{13}$ Ω·cm.

The heater sheet 40 is disposed on the side of the back surface of the electrostatic sheet 10, i.e., on the side of the back surface of the second electrode sheet 14. The heater sheet 40 includes a heater wire 41, and a heater insulating layer 42 configured to cover the heater wire 41. The heater wire 41 is an alloy-based material of a metal, and for example, nickel chrome, iron chrome, or the like. The heater wire 41 is formed so as to have a sheet shape, for example, by forming a wire rod in a reciprocating manner or winding it in a spiral shape.

The heater insulating layer 42 is disposed to surround the heater wire 41 such that the heater wire 41 is not exposed. The heater insulating layer 42 may be formed of the same material as that of the insulator sheet 11. Further, a portion of the heater insulating layer 42 on the side of the front surface is fixed to the back surface of the second electrode sheet 14 by fusion (for example, heat fusion) thereof. Further, a front surface side of the heater insulating layer 42 is also fixed to an exposing surface of the back surface of the insulator sheet 11 through fusion thereof. In addition, a portion of the heater insulating layer 42 on the side of the back surface is fixed to the attachment surface of the base member 20 through fusion (for example, heat fusion) thereof.

Since the transducer 2 has a heater function, it is possible to apply heat to the object person in addition to detection of a state of the object person or application of vibrations or the like to the object. In particular, by setting the thermal conductivity of the insulator sheet 11 and the heater insulating layer 42 as described above, the heat of the heater wire 41 can be transferred to the surface of the electrostatic sheet 10. In addition, since the insulator sheet 11 and the heater insulating layer 42 have flame retardance fillers, the heat resistance effect can be improved.

In addition, as the electric power is supplied to the heater wire 41, the heater wire 41 may become a noise source. However, the second electrode sheet 14 exhibits a high shield function for the heater wire 41. That is, even if noise is generated by the electric power supplied to the heater wire 41, the second electrode sheet 14 can exhibit the shield function. As a result, the transducer 2 can improve detection accuracy as a sensor and operation accuracy as an actuator.

7. Transducer 3 of Third Example

Figure 7:
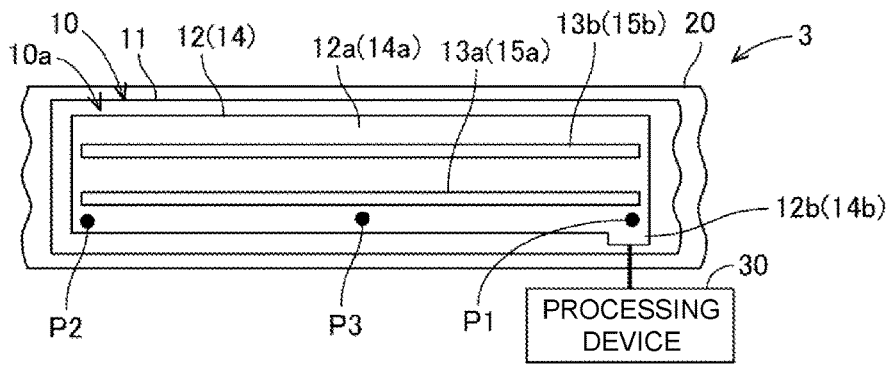
FIG. 7 is a view showing a transducer of a third example.

A transducer 3 of a third example will be described with reference to FIG. 7. In the transducer 3 of the third example, the same components as those of the transducer 1 of the first example are designated by the same reference signs.

The transducer 3 of the third example includes a plurality of first bypass conductors 13a and 13b, and a plurality of second bypass conductors 15a and 15b. The plurality of first bypass conductors 13a and 13b are formed in an elongated shape. A linear metal wire, an undulated metal wire, a mesh-shaped metal wire, conductive fabrics, a conductive elastomer, or the like, can be applied to the first bypass conductors 13a and 13b.

The first bypass conductors 13a and 13b are arranged side by side in the short direction of the first electrode sheet 12. The one first bypass conductor 13 is disposed close to one side of the first electrode sheet 12 in the short direction, and the other first bypass conductor 13 is disposed close to the other side of the first electrode sheet 12 in the short direction. That is, the two first bypass conductors 13a and 13b are disposed on both sides with a center of the first electrode sheet 12 in the short direction sandwiched therebetween.

By arranging the plurality of first bypass conductors 13a and 13b, a substantial electrical resistivity between the positions P2 and P3 far from the terminal part 12b and the terminal part 12b can be reduced. The plurality of second bypass conductors 15a and 15b are also the same as the plurality of first bypass conductors 13a and 13b.

8. Transducer 4 of Fourth Example

Figure 8:
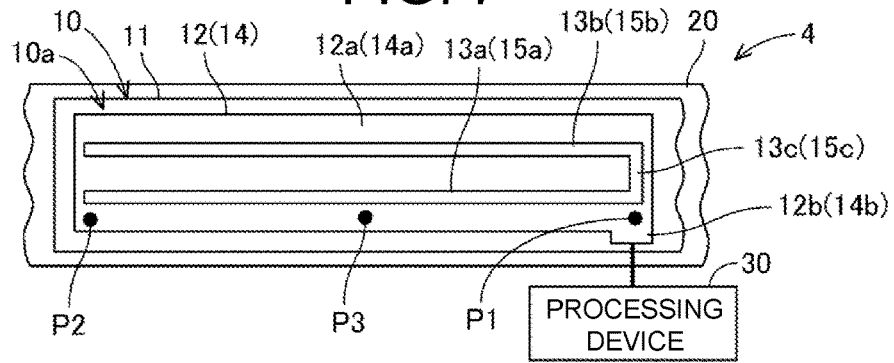
FIG. 8 is a view showing a transducer of a fourth example.

A transducer 4 of a fourth example will be described with reference to FIG. 8. In the transducer 4 of the fourth example, the same components as the transducer 3 of the third example are designated by the same reference signs.

The transducer 4 of the fourth example includes first bypass conductors 13a, 13b and 13c, and second bypass conductors 15a, 15b and 15c. The first bypass conductors 13a and 13b and the second bypass conductors 15a and 15b are the same as those of the transducer 3 of the third example. The first bypass conductor 13c connects an end portion of the first bypass conductor 13a on the side of the terminal part 12b and an end portion of the first bypass conductor 13b on the side of the terminal part 12b. The second bypass conductor 15c connects an end portion of the first bypass conductor 13a on the side of the terminal part 12b and an end portion of the first bypass conductor 13b on the side of the terminal part 12b.

By arranging the plurality of first bypass conductors 13a and 13b and connecting them using the first bypass conductor 13c, a substantial electrical resistivity between the positions P2 and P3 far from the terminal part 12b and the terminal part 12b can be reduced. The second bypass conductors 15a, 15b and 15c are also the same as the first bypass conductors 13a, 13b and 13c.

9. Transducer 5 of Fifth Example

Figure 9:
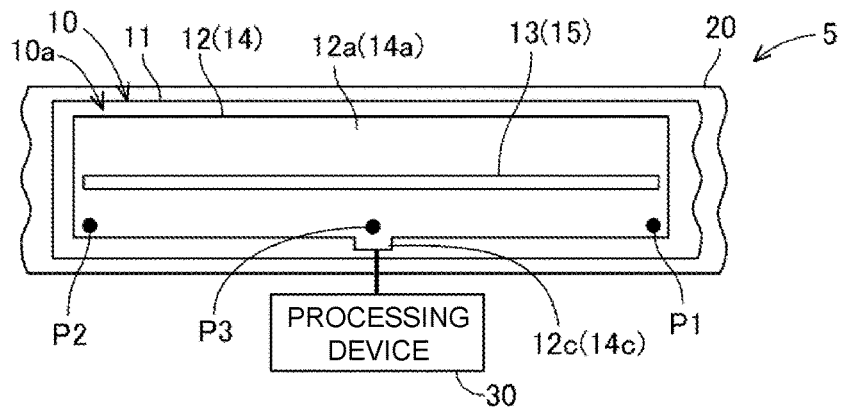
FIG. 9 is a view showing a transducer of a fifth example.

A transducer 5 of a fifth example will be described with reference to FIG. 9. In the transducer 5 of the fifth example, the same components as the transducer 1 of the first example are designated by the same reference numerals.

The first electrode sheet 12 includes one first electrode sheet main body 12a and one terminal part 12c. The one terminal part 12c is disposed on a central section (a center in the leftward/rightward direction of FIG. 9) of the first electrode sheet main body 12a in the longitudinal direction. That is, when the first electrode sheet main body 12a is equally divided into two parts in the longitudinal direction, the one terminal part 12c is disposed at the division position. Then, the first bypass conductor 13 is disposed from a first end portion (a right end of FIG. 9) of the first electrode sheet 12 in the longitudinal direction to a second end portion (a left end of FIG. 9) opposite to the first end portion.

Accordingly, when the one terminal part 12c is disposed on the central section in the longitudinal direction, a distance from the terminal part 12c to the positions P1 and P2 of both ends of the first electrode sheet 12 is reduced. Further, a substantial electrical resistivity between the terminal part 12c and the positions P1 and P2 can be reduced via the first bypass conductor 13. Further, the second electrode sheet 14 includes one second electrode sheet main body 14a and one terminal part 14c. The terminal part 14c is the same as the terminal part 12c of the first electrode sheet 12.

10. Transducer 6 of Sixth Example

Figure 10:
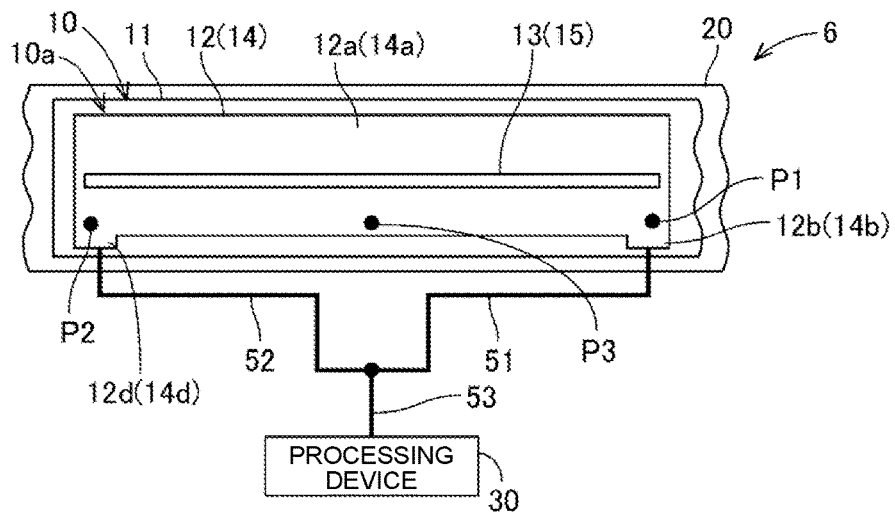
FIG. 10 is a view showing a transducer of a sixth example.

A transducer 6 of a sixth example will be described with reference to FIG. 10. In the transducer 6 of the sixth example, the same components as the transducer 1 of the first example are designated by the same reference signs.

In the transducer 6 of the sixth example, the first electrode sheet 12 includes the first electrode sheet main body 12a and the plurality of terminal parts 12b and 12d. The plurality of terminal parts 12b and 12d are disposed at different positions of the first electrode sheet 12 in the longitudinal direction. In the example, a case in which the transducer 6 includes the two terminal parts 12b and 12d is exemplified. The first terminal part 12b is disposed at a first end portion of the first electrode sheet 12 in the longitudinal direction. The second terminal part 12d is disposed at a second end portion of the first electrode sheet 12 in the longitudinal direction. Further, one or more terminal parts can also be added to the central section of the first electrode sheet 12 in the longitudinal direction.

The first bypass conductor 13 is disposed from the first end portion (a right end of FIG. 10) of the first electrode sheet 12 in the longitudinal direction to the second end portion (a left end of FIG. 10) opposite to the first end portion. That is, the first end portion of the first bypass conductor 13 in the longitudinal direction is disposed on the side of the first terminal part 12b in an elongated shape of the first electrode sheet 12. Meanwhile, the second end portion of the first bypass conductor 13 in the longitudinal direction is disposed on the side of the second terminal part 12d in an elongated shape of the first electrode sheet 12.

In addition, the second electrode sheet 14 includes the second electrode sheet main body 14a, a first terminal part 14b, and a second terminal part 14d. The first terminal part 14b and the second terminal part 14d of the second electrode sheet 14 are the same as the first electrode sheet 12.

Further, in the transducer 6, the terminal parts 12b, 12d, 14b and 14d and the processing device 30 include a first terminal connection wiring part 51, a second terminal connection wiring part 52 and a coupling wiring part 53.

The first terminal connection wiring part 51 has one end electrically connected to the first terminal parts 12b and 14b. The second terminal connection wiring part 52 has one end electrically connected to the second terminal parts 12d and 14d. Then, the other end of the first terminal connection wiring part 51 is electrically connected to the other end of the second terminal connection wiring part 52. The coupling wiring part 53 constitutes one input/output end from a connecting position of the first terminal connection wiring part 51 and the second terminal connection wiring part 52. Then, the coupling wiring part 53 is connected to the processing device 30.

That is, current obtained by combining current flowing to the first terminal connection wiring part 51 and current flowing to the second terminal connection wiring part 52 flows to the coupling wiring part 53. Accordingly, for the processing device 30, since both of the position P1 and the position P2 in the first electrode sheet 12 are disposed in the vicinity of the terminal parts 12b and 12d, a substantial electrical resistance is substantially the same. A position at which an electrical resistance from the first terminal part 12b and the second terminal part 12d is largest becomes the position P3.

Accordingly, in the first electrode sheet 12 and the first bypass conductor 13, distribution of the electrical resistance starting from the terminal parts 12b and 12d is divided into two parts of the first electrode sheet 12 in the longitudinal direction. That is, since the position at which the electrical resistance from the terminal parts 12b and 12d is largest can become the position P3 at the center in the longitudinal direction, an influence of the electrical resistance of the first electrode sheet 12 can be reduced. Accordingly, detection accuracy or driving accuracy can be improved.

Further, when the first electrode sheet 12 includes the terminal parts 12b and 12d on both ends in the longitudinal direction and further includes one or more terminals part in the middle of the longitudinal direction, the first electrode sheet main body 12a is divided into two or more parts at equal intervals, and the terminal parts may be disposed at both ends and the division positions. When the number of divisions is M, the number of terminal parts is two at both ends and M−1 in the middle. That is, the total number of terminal parts is M+1. In this case, a length to a position at which the electrical resistance from each of the terminal part is largest is a half of a length corresponding to one division of the first electrode sheet main body 12a. The second electrode sheet 14 is also the same.

11. Transducer 7 of Seventh Example

Figure 11:
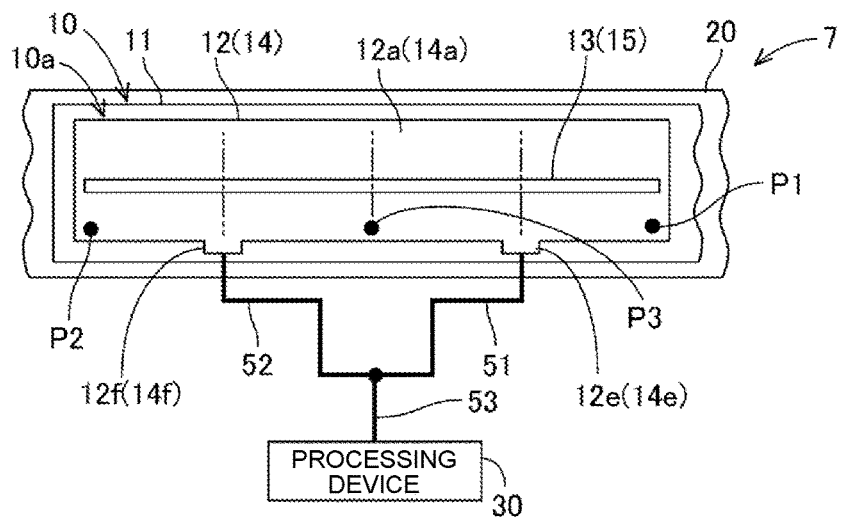
FIG. 11 is a view showing a transducer of a seventh example.

A transducer 7 of a seventh example will be described with reference to FIG. 11. In the transducer 7 of the seventh example, the same components as the transducer 1 of the first example are designated by the same reference signs.

In the transducer 7 of the seventh example, the first electrode sheet 12 includes a first electrode sheet main body 12a and a plurality of terminal parts 12e and 12f. The plurality of terminal parts 12e and 12f are disposed at different positions of the first electrode sheet 12 in the longitudinal direction. However, the plurality of terminal parts 12e and 12f are not disposed on both ends of the first electrode sheet 12 in the longitudinal direction and disposed in the middle of the longitudinal direction.

In the example, the first electrode sheet main body 12a is equally divided into four parts in the longitudinal direction. Then, in the three division positions, the first terminal part 12e and the second terminal part 12f are disposed at two places on both end sides. That is, the terminal parts 12e and 12f are not disposed at a central division position.

In this case, a position at which the electrical resistance from the first terminal part 12e and the second terminal part 12d is largest becomes each of the positions P1, P2 and P3. That is, a length to the position at which the electrical resistance is largest is a length of the first electrode sheet 12 divided into four parts. Accordingly, since the electrical resistance that is largest from the terminal parts 12e and 12f can be reduced, detection accuracy or driving accuracy can be improved.

Here, when the first electrode sheet 12 does not include the terminal part on both ends, the first electrode sheet main body 12a is equally divided into N parts (N is an even number) at equal intervals in the longitudinal direction, the terminal part may be disposed at two division positions on both ends in N−1 division positions, and one may be skipped. That is, when the number of terminal parts is N/2. In this case, a length to the position at which the electrical resistance from each of the terminal parts is largest is a length corresponding to one division of the first electrode sheet main body 12a. The second electrode sheet 14 is also the same.

12. Transducer 8 of Eighth Example

Figure 12:
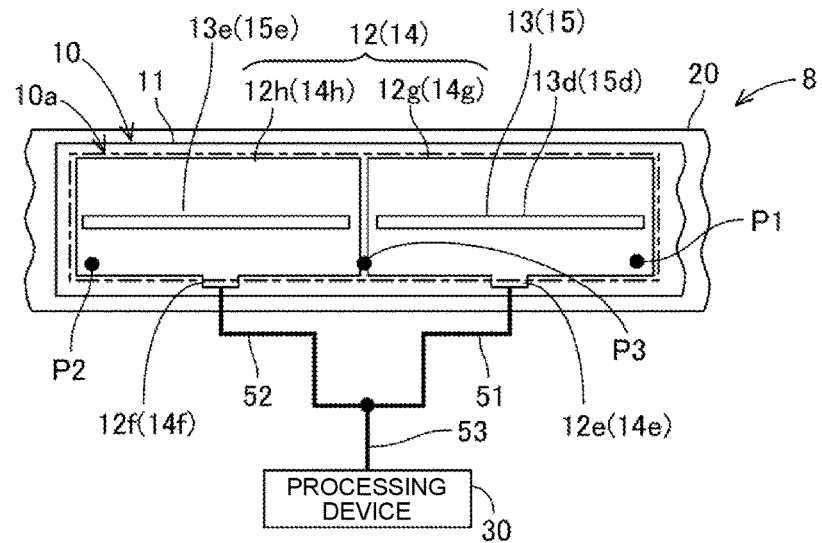
FIG. 12 is a view showing a transducer of an eighth example.

A transducer 8 of an eighth example will be described with reference to FIG. 12. In the transducer 8 of the eighth example, the same components as the transducer 7 of the seventh example are designated by the same reference signs.

The transducer 8 of the eighth example has a configuration in which the first electrode sheet 12 and the first bypass conductor 13 are divided at division positions where the terminal parts are not disposed when the first electrode sheet main body 12a is divided in the longitudinal direction in the transducer 7 of the seventh example. The second electrode sheet 14 and the second bypass conductor 15 are also the same.

That is, in the transducer 8, the first electrode sheet 12 is constituted by a sheet including a first division electrode sheet 12g and a terminal part 12e and a sheet including a first division electrode sheet 12h and a terminal part 12d. The second electrode sheet 14 is constituted by a sheet including a second division electrode sheet 14g and a terminal part 14e and a sheet including a second division electrode sheet 14h and a terminal part 14d. The first bypass conductor 13 is constituted by first division bypass conductors 13d and 13c. The second bypass conductor 15 is constituted by second division bypass conductors 15d and 15e.

The transducer 8 of the eighth example exhibits substantially the same effect as the transducer 7 of the seventh example. That is, when the first electrode sheet main body is equally divided into L parts (L is an integer of 2 or more) at equal intervals in the longitudinal direction, the terminal part is disposed on a central section of the longitudinal direction of the divided regions. The second electrode sheet 14 is also the same.

13. Transducer 9 of Ninth Example

Figure 13:
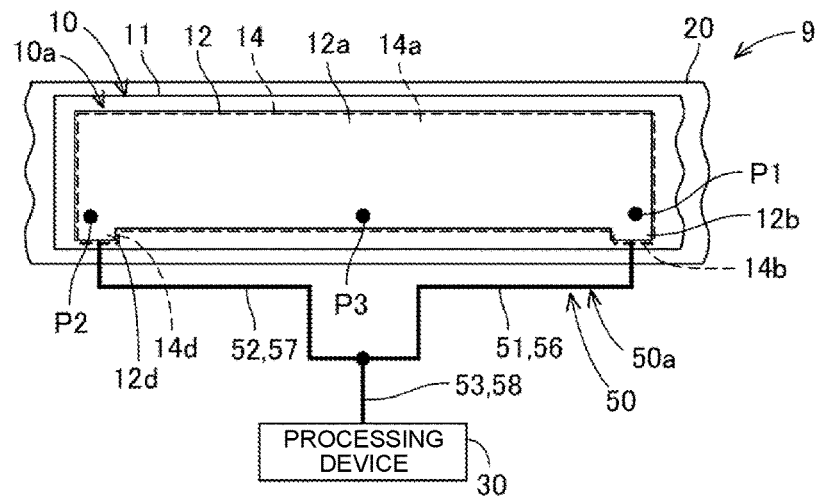
FIG. 13 is a view showing a transducer of a ninth example.

A transducer 9 of a ninth example will be described with reference to FIG. 13. In the transducer 8 of the eighth example, the same components as the transducer 6 of the sixth example are designated by the same reference signs. The transducer 9 includes an electrostatic sheet 10, a base member 20, a processing device 30 and a wiring 50. The transducer 9 is configured not to include the first bypass conductor 13 and the second bypass conductor 15 in the transducer 6 of the sixth example.

The electrostatic sheet 10 includes, at least, the insulator sheet 11 and the first electrode sheet 12. A case in which the electrostatic sheet 10 further includes the second electrode sheet 14 is exemplified. The first electrode sheet 12 includes one first electrode sheet main body 12a, and a plurality of terminal parts 12b and 12d. The plurality of terminal parts 12b and 12d are disposed at different positions of the first electrode sheet 12 in the longitudinal direction.

The second electrode sheet 14 is laminated on the side of the back surface of the insulator sheet 11, i.e., a surface of the insulator sheet 11 opposite to the first electrode sheet 12. The second electrode sheet 14 includes one second electrode sheet main body 14a, and a plurality of terminal parts 14b and 14d.

The wiring 50 is a wiring configured to electrically connect the plurality of terminal parts 12b and 12d and the processing device 30 in the first electrode sheet 12 that constitutes the target region 10a. The wiring 50 is a wiring connected to the first electrode sheet 12, and includes a plurality of terminal connection wiring parts 51 and 52 and a coupling wiring part 53. In addition, the wiring 50 is a wiring connected to the second electrode sheet 14, and includes a plurality of terminal connection wiring parts 56 and 57 (opposite surface terminal connection wiring parts) and a coupling wiring part 58 (an opposite surface coupling wiring part).

Since the first electrode sheet 12 is formed of an elastomer having conductive fillers, the first electrode sheet 12 has higher flexibility than that of the metal sheet or conductive fabrics. The second electrode sheet 14 is also the same. Accordingly, when the transducer 1 is attached to the attachment object of the base member 20, attachment properties become better.

However, since the first electrode sheet 12 is formed of an elastomer containing conductive fillers, the electrical resistivity is larger than that of the metal sheet or conductive fabrics. Here, in the first electrode sheet 12 as a single body, the electrical resistance between the first terminal part 12b and the position P1 close to the first terminal part 12b is small. However, in the first electrode sheet 12 as a single body, the electrical resistance between the first terminal part 12*b* and the position P2 (shown in FIG. 2) far from the first terminal part 12*b* is increased. Naturally, in the first electrode sheet 12 as a single body, the electrical resistance between the first terminal part 12*b* and the position P3 disposed in the middle of the first electrode sheet 12 in the longitudinal direction is about intermediate.

However, the first electrode sheet 12 constitutes one target region 10*a* and includes the plurality of terminal parts 12*b* and 12*d*. That is, the position P2 is far from the first terminal part 12*b* but close to the second terminal part 12*d*. Accordingly, in the first electrode sheet 12 as a single body, the electrical resistance between the position P2 and the first terminal part 12*b* is large but the electrical resistance between the position P2 and the second terminal part 12*d* is small.

Then, the plurality of terminal parts 12*b* and 12*d* are electrically connected to the corresponding terminal connection wiring parts 51 and 52, respectively, and the plurality of terminal connection wiring parts 51 and 52 are electrically connected to the coupling wiring part 53 that constitutes one input/output end. That is, the first electrode sheet 12 that constitutes the one target region 10*a* is electrically connected to the one coupling wiring part 53 via the plurality of terminal parts 12*b* and 12*d* and the plurality of terminal connection wiring parts 51 and 52. In this way, the one target region 10*a* is connected to the one coupling wiring part 53 by a plurality of routes.

That is, current obtained by combining current flowing to the first terminal connection wiring part 51 and current flowing to the second terminal connection wiring part 52 flows to the coupling wiring part 53. Accordingly, for the processing device 30, since both of the position P1 and the position P2 in the first electrode sheet 12 are disposed in the vicinity of the terminal parts 12*b* and 12*d*, a substantial electrical resistance is substantially the same. A position where the electrical resistance from the first terminal part 12*b* and the second terminal part 12*d* is largest becomes the position P3.

Accordingly, even when the position P2 is a position far from the first terminal part 12*b*, it is possible to dispose the first terminal part 12*b* to a position close from the second terminal part 12*d*. Then, in arbitrary positions P1, P2 and P3 in the first electrode sheet 12, detection accuracy as the electrostatic sensor and driving accuracy as the electrostatic actuator depend on the electrical resistance between the arbitrary positions P1, P2 and P3 and the terminal part of any of the plurality of terminal parts 12*b* and 12*d*. That is, a difference in electrical resistance according to the position can be reduced. As a result, detection accuracy and driving accuracy can be improved.

For example, when the electrical resistances of the plurality of terminal connection wiring parts 51 and 52 are the same, the electrical resistance between the coupling wiring part 53 and the position P1 is equal to the electrical resistance between the coupling wiring part 53 and the position P2. That is, detection accuracy or driving accuracy at the position P1 is equal to detection accuracy or driving accuracy at the position P2.

Further, at the position P3, the distance from the first terminal part 12*b* is also equal to the distance from the second terminal part 12*d*. That is, the position P3 is disposed at a position farthest from both of the first terminal part 12*b* and the second terminal part 12*d*. In other words, in the first electrode sheet 12, the maximum electrical resistance is provided between the first terminal part 12*b* and the position P3. Accordingly, even when the first electrode sheet 12 is compared with the case without the second terminal part 12*d*, the maximum electrical resistance in the example becomes a half.

Further, when the first electrode sheet 12 includes the terminal parts 12*b* and 12*d* on both ends in the longitudinal direction and further includes one or more terminal parts in the middle of the longitudinal direction, the first electrode sheet main body 12*a* may be divided into two or more parts at equal intervals, and the terminal parts may be disposed at both ends and the division positions. When the division number is M, the number of terminal parts is two at both ends and M−1 in the middle. That is, the total number of terminal parts is M+. In this case, a length to a position where the electrical resistance from each of the terminal parts is largest is a half of a length corresponding to one division of the first electrode sheet main body 12*a*. Accordingly, detection accuracy or driving accuracy is further improved. In addition, while the first electrode sheet 12 has been described as described above, the second electrode sheet 14 (opposite surface electrode sheet) also exhibits the same effect.

14. Application Target of Electrostatic Transducer Unit

The electrostatic transducer unit (hereinafter, referred to as "a transducer unit") is a member having a centerline. The member having a centerline includes a member having a linear centerline (a rod shape), a member having a curved centerline, or the like. A lateral cross section (a cross-section perpendicular to a shaft) of the member may have an arbitrary shape such as a circular shape, an oval shape, a polygonal shape, or the like. In addition, the member includes a member having both ends, an endless member having a ring shape, a frame shape, or the like. For example, a joystick, an armrest, a door knob, a shift lever, a door trim, a center trim, or the like, is an example of the member having both ends. In addition, a grip portion of a steering wheel is an example of the endless member. Further, the grip portion of the steering wheel is exemplified as an example of the member having both ends in the case of an arc shape such as a C shape or the like.

15. Example of Transducer Unit 100

As an example of a transducer unit 100, a steering wheel 200 is exemplified and will be described with reference to FIG. 14. The steering wheel 200 is, for example, a steering wheel having a sensor function capable of detecting a contact of a driver's hand. Further, the steering wheel 200 may have an actuator function that applies vibrations or the like to the driver's hand.

Figure 14:
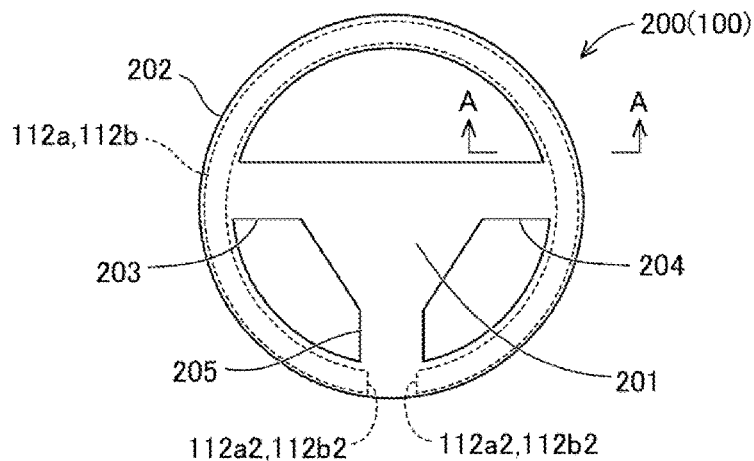
FIG. 14 is a front view of a steering wheel as the transducer unit of the first example.

As shown in FIG. 14, the steering wheel 200 includes a core part 201 disposed at a center, a ring-shaped grip part 202, and a plurality of connecting parts 203, 204 and 205 configured to connect the core part 201 and the grip part 202. The grip part 202 is an area gripped by a driver for steering. The grip part 202 has a function of a sensor configured to detect a contact of a driver's hand.

Here, in the example, the grip part 202 has a function of a sensor substantially throughout the circumference. For example, the grip part 202 can detect each contact of two regions of the front surface and the back surface. That is, the grip part 202 includes the transducer 112*a* disposed on the front surface, and the transducer 112*b* disposed on the back surface.

16. Transducer Unit 110 of First Example

A configuration of a transducer unit 110 of the first example will be described with reference to FIGS. 14 and 15. In particular, as an example of the transducer unit 110, a specific configuration of the grip part 202 of the steering wheel 200 will be described.

The grip part 202 of the steering wheel 200 includes a core member 111 having a centerline, the transducers 112a and 112b, a resin inner layer member 113, and a skin material 114. A front surface shape of the core member 111 is formed in, for example, a ring shape. That is, the core member 111 is a member having a ring-shaped centerline. The core member 111 is formed of a metal having conductivity, for example, aluminum or the like. Then, the core member 111 is connected to, for example, a ground potential. The core member 111 is connected to the connecting parts 203, 204 and 205 shown in FIG. 14. While the case in which a cross-sectional shape perpendicular to the shaft of the core member 111 is, for example, a U shape is exemplified, the shape may be an arbitrary shape such as a circular shape, an oval shape, a polygonal shape, or the like. Further, the core member 111 may be formed of a non-conductive resin.

The transducers 112a and 112b apply any one the transducers 1 to 9 described above. In FIG. 15, the transducer 112a of the front surface is disposed on the upper side of the drawing, and the transducer 112b of the back surface is disposed on the lower side of the drawing. FIG. 15 shows a case in which the transducers 112a and 112b include the insulator sheet 11, the first electrode sheet 12 and the second electrode sheet 14. For example, the first electrode sheet 12 functions as a sensor electrode, and the second electrode sheet 14 functions as a shield electrode.

The transducers 112a and 112b are disposed to oppose each other with a distance to an outer surface of the core member 111. That is, as shown in FIG. 15, the transducers 112a and 112b are disposed along an outer circumferential surface of the core member 111 to face the outer circumferential surface about the centerline of the core member 111. Further, the transducers 112a and 112b are disposed in a ring-shaped circumferential direction of the core member 111.

Here, the second electrode sheet 14 that constitutes the transducers 112a and 112b is disposed on the side of the core member 111. That is, the back surface of the second electrode sheet 14 is disposed along the outer circumferential surface of the core member 111 and in the circumferential direction of the core member 111 to face the outer circumferential surface about the centerline of the core member 111. That is, the back surface of the second electrode sheet 14 constitutes back surfaces of the transducers 112a and 112b.

Figure 15:
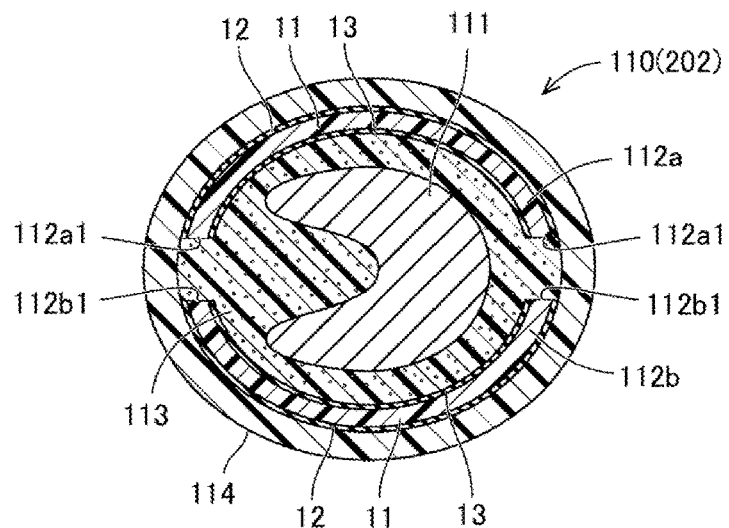
FIG. 15 is an enlarged cross-sectional view along line A-A in FIG. 14.

Here, as shown in FIG. 15, end sides of the transducers 112a and 112b in the circumferential direction of the outer circumferential surface of the core member 111 are defined as first end sides 112a1 and 112b1. In addition, as shown in FIG. 14, end sides of the transducers 112a and 112b in the ring-shaped circumferential direction of the core member 111 are defined as second end sides 112a2 and 112b2.

The two first end sides 112a1 and 112b1 of the transducers 112a and 112b are disposed to oppose each other with a distance in the circumferential direction of the outer circumferential surface of the core member 111. For example, in FIG. 15, the first end side 112a1 of the transducer 112a and the first end side 112b1 of the transducer 112b are disposed to oppose each other with a distance in the circumferential direction of the outer circumferential surface of the core member 111.

In addition, the two second end sides 112a2 and 112b2 of the transducers 112a and 112b are disposed to oppose each other with a distance in the ring-shaped circumferential direction of the core member 111. For example, in FIG. 14, the second end side 112a2 of the transducer 112a and the second end side 112b2 of the transducer 112b are disposed to oppose each other with a distance in the ring-shaped circumferential direction of the core member 111.

The resin inner layer member 113 is fixed to the core member 111 and the transducers 112a and 112b via a space between the outer circumferential surface of the core member 111 and the back surfaces of the transducers 112a and 112b. The resin inner layer member 113 is molded through injection molding. By using the core member 111 and the transducers 112a and 112b as mold inserts, the resin inner layer member 113 is fixed to the core member 111 and the transducers 112a and 112b when injection molding is terminated. The resin inner layer member 113 is molded of resin foam such as urethane foam or the like. Further, the resin inner layer member 113 may be molded of non-foaming resin.

Further, the resin inner layer member 113 is interposed in a gap between the two first end sides 112a1 and 112b1 disposed to oppose each other in the circumferential direction of the outer circumferential surface of the core member 111. In addition, the resin inner layer member 113 is interposed in a gap between the two second end sides 112a2 and 112b2 disposed to oppose each other in the ring-shaped circumferential direction of the core member 111.

The skin material 114 covers surfaces of the transducers 112a and 112b. The skin material 114 may be molded of a resin through injection molding, or leather may be used.

When the transducers 112a and 112b are disposed along the outer circumferential surface of the core member 111, the resin inner layer member 113 is disposed between the outer circumferential surface of the core member 111 and the back surfaces of the transducers 112a and 112b, and the resin inner layer member 113 is fixed to the outer circumferential surface of the core member 111 and the back surfaces of the transducers 112a and 112b. Accordingly, it is possible to prevent the transducers 112a and 112b from peeling off from the core member 111.

Further, since the resin inner layer member 113 is interposed in the gap between the two end sides (the first end side and the second end side) opposite to each other in the transducers 112a and 112b, design properties of the transducer unit 110 becomes better. In addition, the transducer unit 110 can be easily manufactured by applying the resin inner layer member 113.

Here, in the case of the configuration in which the transducers 112a and 112b include the heater sheet 40 such as the transducer 6 of the above-mentioned sixth example, the resin inner layer member 113 is fixed to the heater sheet 40.

17. Transducer Unit 120 of Second Example

A configuration of a transducer unit 120 of the second example will be described with reference to FIGS. 16 and 17. As an example of the transducer unit 120, like the first example, a specific configuration of the grip part 202 of the steering wheel 200 will be described. In addition, in the transducer unit 120 of the second example, the same components as the first example are designated by the same reference signs and description thereof will be omitted.

Figure 16:
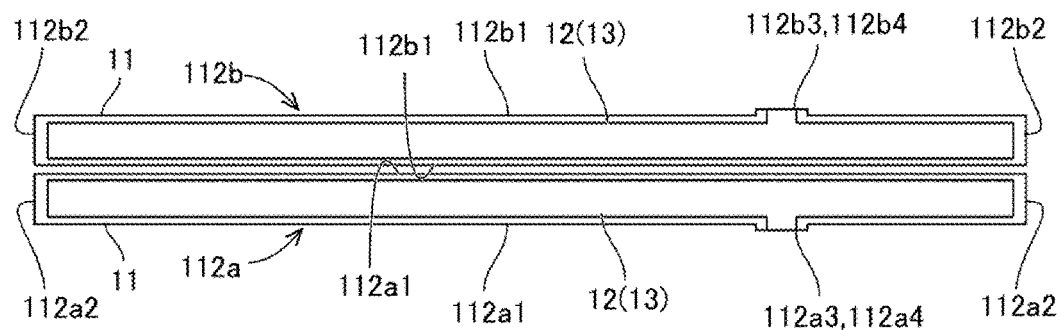
FIG. 16 is a view showing a transducer applied to a transducer unit of the second example.

As shown in FIG. 16, the transducers 112*a* and 112*b* include first terminal parts 112*a*3 and 112*b*3 electrically connected to the first electrode sheet 12. The first terminal parts 112*a*3 and 112*b*3 are molded in the same way as the first electrode sheet 12, and overhang from a long side of the first electrode sheet 12.

In addition, as shown in FIG. 16, the transducers 112*a* and 112*b* include second terminal parts 112*a*4 and 112*b*4 electrically connected to the second electrode sheet 14. The second terminal parts 112*a*4 and 112*b*4 are molded in the same way as the second electrode sheet 14, and overhang from a long side of the second electrode sheet 14.

Figure 17:
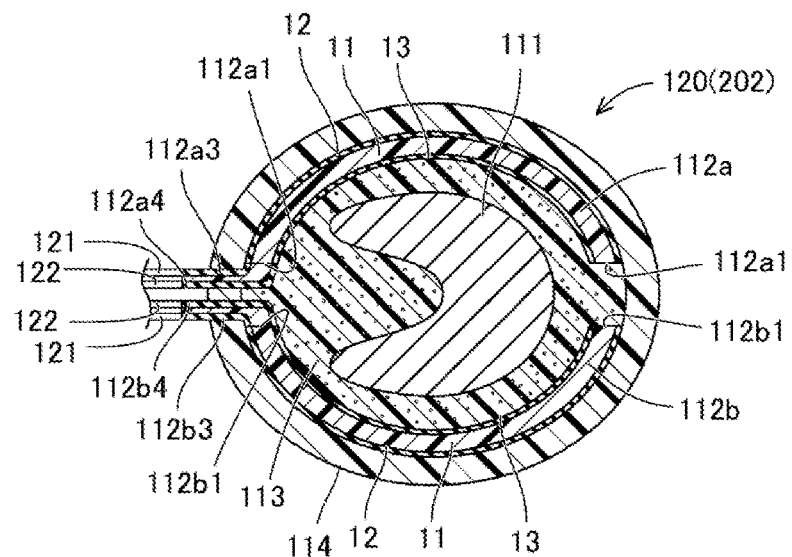
FIG. 17 is an enlarged cross-sectional view of the transducer unit of the second example along line A-A in FIG. 14.

As shown in FIG. 17, at least parts of the first terminal parts 112*a*3 and 112*b*3 and at least parts of the second terminal parts 112*a*4 and 112*b*4 are disposed with a gap between the first end sides 112*a*l and 112*b*1 disposed to oppose each other. Then, ends of the first terminal parts 112*a*3 and 112*b*3 and ends of the second terminal parts 112*a*4 and 112*b*4 extend outward from the skin material 114, and are electrically connected to a first wiring 121 and a second wiring 122. Further, for example, the first wiring 121 and the second wiring 122 extend to the vicinity of the core part 201 of the steering wheel 200, and are connected to a detection circuit (not shown).

That is, at least parts of the first terminal parts 112*a*3 and 112*b*3 and at least parts of the second terminal parts 112*a*4 and 112*b*4 are disposed with a gap between the first end sides 112*a*1 and 112*b*1 disposed to oppose each other, and thus, design properties can be improved.

In addition, at least parts of the first terminal parts 112*a*3 and 112*b*3 and at least parts of the second terminal parts 112*a*4 and 112*b*4 may be disposed with a gap between the second end sides 112*a*2 and 112*b*2 disposed to oppose each other, instead of the gap between the first end sides 112*a*l and 112*b*1.

18. Transducer Unit 130 of Third Example

A configuration of a transducer unit 130 of the third example will be described with reference to FIG. 18. Like the second example, as an example of the transducer unit 130, a specific configuration of the grip part 202 of the steering wheel 200 will be described. In addition, in the transducer unit 130 of the third example, the same components as the second example are designated by the same reference signs and description thereof will be omitted.

Figure 18:
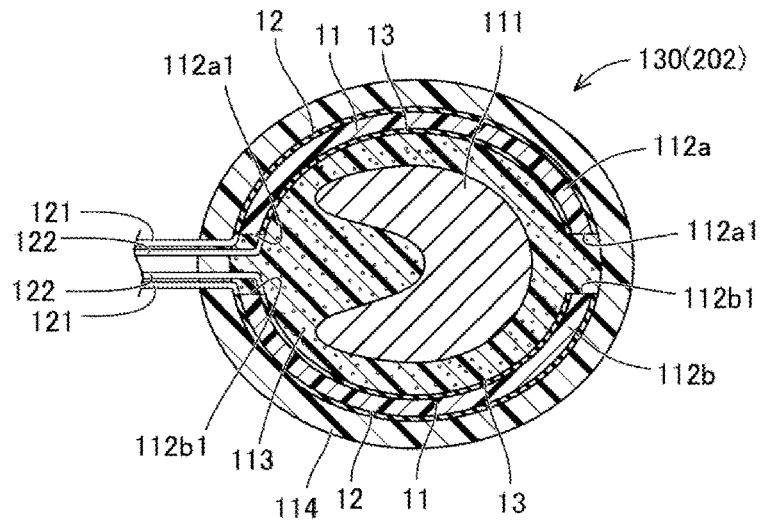
FIG. 18 is an enlarged cross-sectional view of the transducer unit of the third example along line A-A in FIG. 14.
Figure 19:
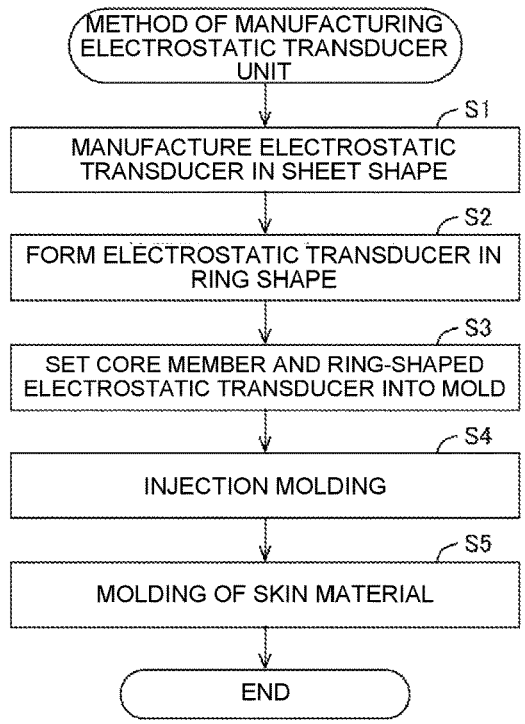
FIG. 19 is a flowchart showing a method of manufacturing the transducer unit of the fourth example.

As shown in FIG. 18, the transducers 112*a* and 112*b* include the first wiring 121 electrically connected to the first electrode sheet 12. For example, one end of the first wiring 121 is connected to a long side of the first electrode sheet 12. In addition, the transducers 112*a* and 112*b* include the second wiring 122 electrically to the second electrode sheet 14. One end of the second wiring 122 is connected to a long side of the second electrode sheet 14.

As shown in FIG. 18, at least parts of the first wiring 121 and at least parts of the second wiring 122 are disposed in a gap between the first end sides 112*a*l and 112*b*1 disposed to oppose each other. Then, the other end of the first wiring 121 and the other end of the second wiring 122 extend outward from the skin material 114, for example, extend to the vicinity of the core part 201 of the steering wheel 200, and are connected to a detection circuit (not shown). That is, at least a part of the first wiring 121 and at least a part of the second wiring 122 are disposed in a gap between the first end sides 112*a*l and 112*b*1 disposed to oppose each other, and thus, design properties can be improved.

In addition, at least a part of the first wiring 121 and at least a part of the second wiring 122 may be disposed in a gap between the second end sides 112*a*2 and 112*b*2 disposed to oppose each other, instead of the gap between the First end sides 112*a*1 and 112*b*1.

19. Transducer Unit 140 of Fourth Example and Method of Manufacturing the Same A configuration and a manufacturing method of a transducer unit 140 of the fourth example will be described with reference to FIGS. 19 to 26. As an example of the transducer unit 140, like the second example, a specific configuration of the grip part 202 of the steering wheel 200 will be described. In addition, in the transducer unit 130 of the third example, the same components as the second example are designated by the same reference numerals and description thereof will be omitted.

Figure 20:
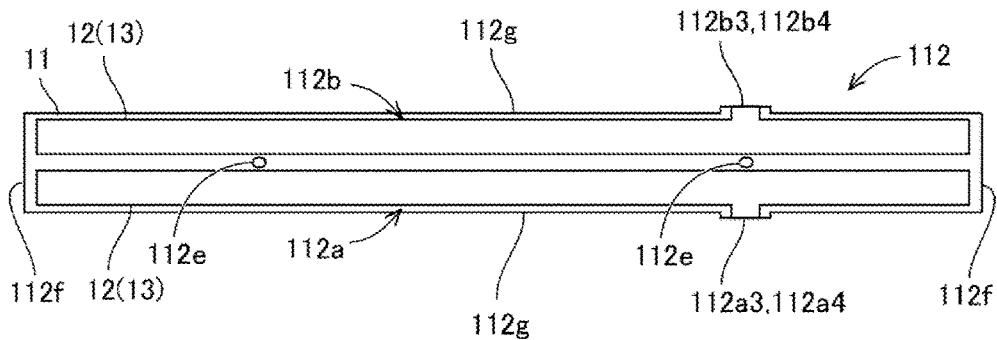
FIG. 20 is a view showing the transducer applied to the transducer unit of the fourth example.

The transducer 112 shown in FIG. 20 is molded in a sheet shape (step S1). The transducer 112 is a sheet in which the two transducers 112*a* and 112*b* shown in FIG. 16 are integrated. That is, portions of the insulator sheets 11 of the two transducers 112*a* and 112*b* are integrated. In addition, the transducer 112 has the first terminal parts 112*a*3 and 112*b*3 and the second terminal parts 112*a*4 and 112*b*4. The transducer 112 formed in a sheet shape has a first end side 112*f* that is a short side, and a second end side 112*g* that is a long side.

Further, the transducer 112 has a third through-hole 112*e* passing in a thickness direction in a region in which the first electrode sheet 12 and the second electrode sheet 14 are not disposed. In the example, two third through-holes 112*e* are formed between the transducers 112*a* and 112*b*.

Figure 21:
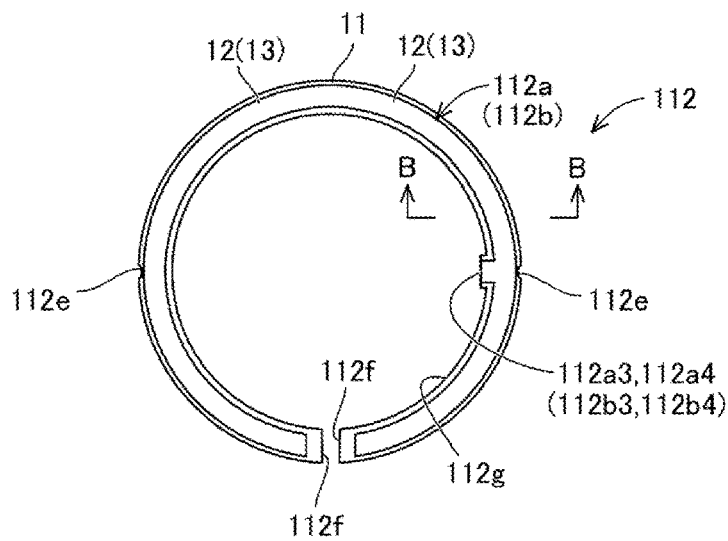
FIG. 21 is a front view of the transducer that was previously molded.

Next, as shown in FIG. 21, the transducer 112 formed in a sheet shape is previously molded in a cylindrical ring shape (step S2). The previously molded transducer 112 is molded such that the two first end sides 112*f* face each other in the ring-shaped circumferential direction. In FIG. 21, facing areas are disposed on a lower side.

Figure 22:
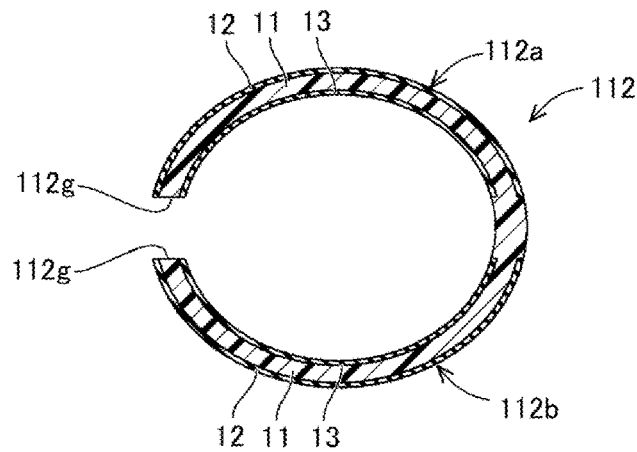
FIG. 22 is an enlarged cross-sectional view along line B-B in FIG. 21.

Further, as shown in FIG. 22, the previously molded transducer 112 is molded such that the two second end sides 112*g* face each other in the outer circumferential surface about a cylindrical centerline. As shown in FIGS. 21 and 22, the two second end sides 112*g* facing each other are disposed on sides facing a ring-shaped center.

Figure 23:
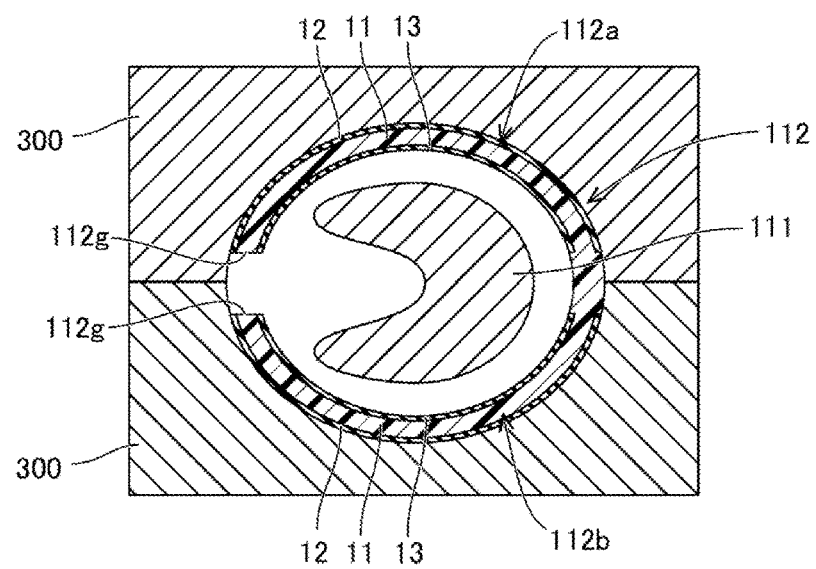
FIG. 23 is a cross-sectional view before injection molding.
Figure 24:
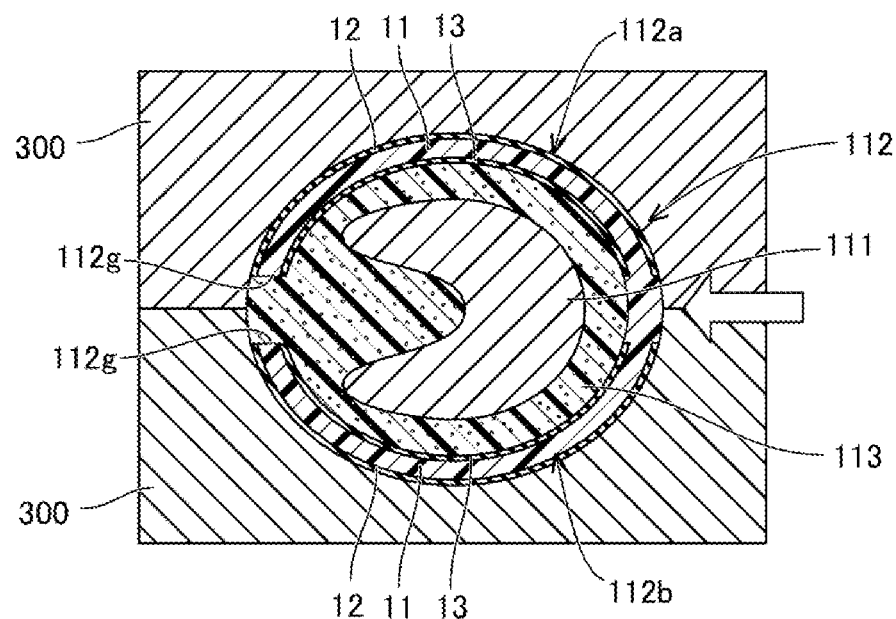
FIG. 24 is a cross-sectional view after injection molding.

Next, as shown in FIG. 23, the core member 111 and the transducer 112 previously molded in the ring shape are set in a mold 300 (step S3). Next, as shown in FIG. 23, the resin inner layer member 113 is molded through injection molding (step S4). Here, the third through-hole 112*e* functions as a resin injection hole for injection molding, and a gap between the facing first end sides 112*f* or a gap between the facing second end sides 112*g* functions as an air vent hole upon resin injection. In addition, a gap between the facing first end sides 112*f* or a gap between the facing second end sides 112*g* may function as a resin injection hole for injection molding, and the third through-hole 112*e* may function as an air vent hole upon resin injection. Then, the resin inner layer member 113 is disposed in the gap between the facing first end sides 112*f*, the gap between the facing second end sides 112*g*, and the third through-hole 112*e*.

Figure 25:
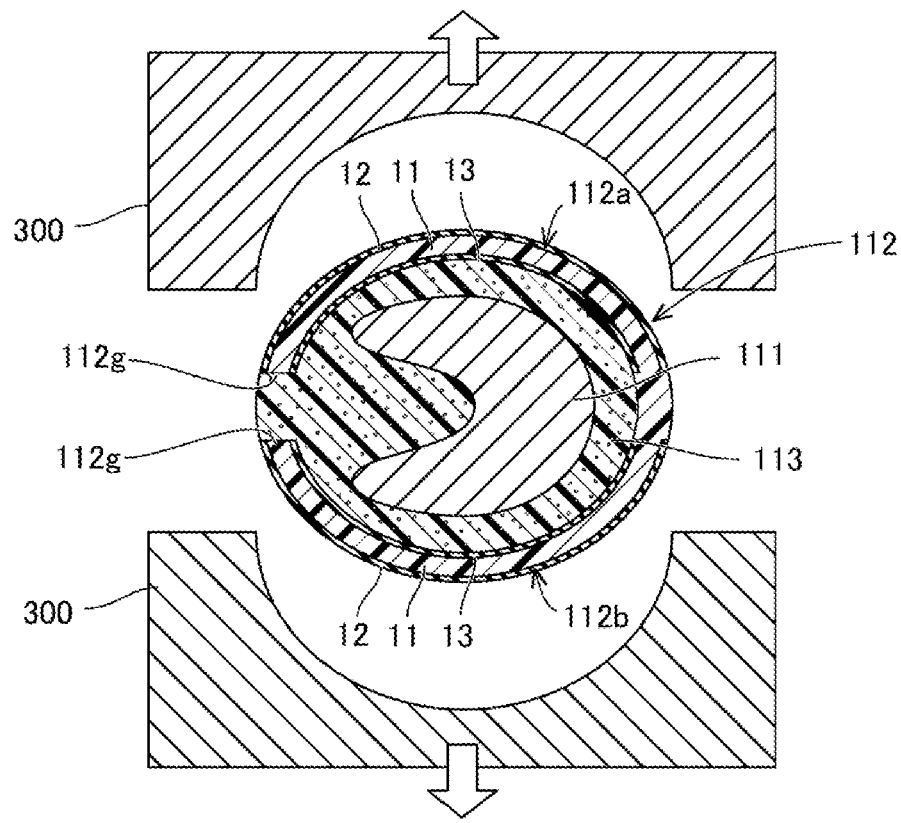
FIG. 25 is a cross-sectional view of a state in which a mold is separated after injection molding.
Figure 26:
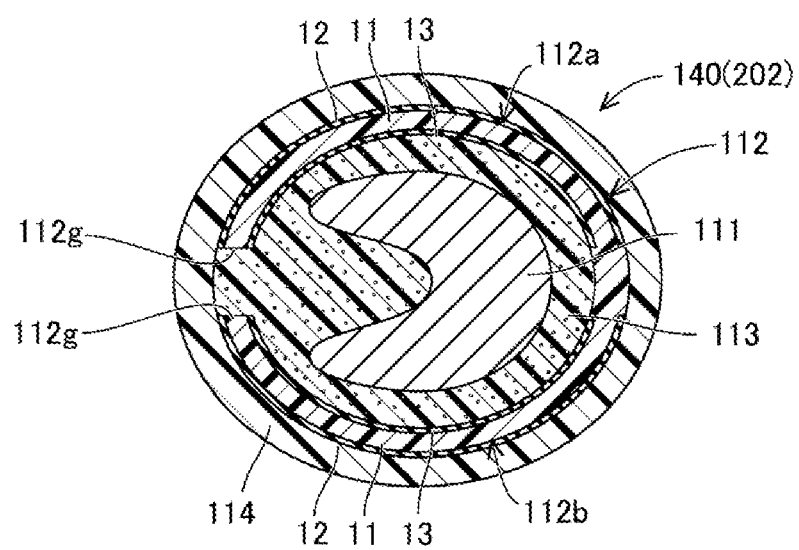
FIG. 26 is an enlarged cross-sectional view of the transducer unit of the fourth example along line A-A in FIG. 14.

Then, as shown in FIG. 25, the core member 111, the transducer 112 and the resin inner layer member 113 are molded by releasing the mold 300. Next, as shown in FIG. 26, the skin material 114 is molded through injection molding or the like (step S5). As a result, the steering wheel 200 as the transducer unit 140 is completed. The transducer unit 140 manufactured as described above is easily manufactured, and design properties are improved.

Here, in the above-mentioned description, the first terminal parts 112a3 and 112b3 and the second terminal parts 112a4 and 112b4 are disposed in the gap between the facing second end sides 112g. However, in addition, the first terminal parts 112a3 and 112b3 and the second terminal parts 112a4 and 112b4 may be disposed in the gap between the facing first end sides 112f. Further, the first terminal parts 112a3 and 112b3 and the second terminal parts 112a4 and 112b4 may be disposed in the third through-hole 112e.

In addition, as shown in FIG. 18, when the transducer 112 does not have the first terminal parts 112a3 and 112b3 and the second terminal parts 112a4 and 112b4, if the transducer 112 has the first wiring 121 and the second wiring 122, the first wiring 121 and the second wiring 122 may be disposed in the gap between the facing second end sides 112g. In addition, the first wiring 121 and the second wiring 122 may be disposed in the gap between the facing first end sides 112f. Alternatively, the first wiring 121 and the second wiring 122 may be disposed in the third through-hole 112e.

19. Others

While the first terminal parts 112a3 and 112b3 or the second terminal parts 112a4 and 112b4 in the transducer unit 110, 120, 130 or 140 of the first example to the fourth example are provided at the positions corresponding to the terminal parts 12b, 12c, 12d, 12e and 12f of the transducer of the first example to ninth example, they may be provided on the other positions.

In the transducer unit 110, 120, 130 or 140 of the first example to fourth example, while the configuration in which the transducer 112a is disposed on the front surface and the transducer 112b is disposed on the back surface has been disclosed, a plurality of transducers may be disposed on one or both of the front surface and the back surface.

In this case, the resin inner layer member can be interposed in the gap between the second end sides of the adjacent transducers disposed to oppose each other in the ring-shaped circumferential direction. In this case, each of the plurality of transducers may include the first terminal part and the second terminal part at intermediate positions or the like in the ring-shaped circumferential direction. In addition, each of the plurality of transducers may include the first terminal part and the second terminal part at the second end sides facing each other in the ring-shaped circumferential direction.

The invention claimed is:

1. An electrostatic transducer unit comprising:
a core member having a centerline;
an electrostatic transducer comprising:
  an insulator sheet;
  at least one electrode sheet, laminated on the insulator sheet, constituting one target region as a detection region or a driving region, formed of an elastomer containing conductive fillers, and including at least one terminal part; and
  at least one bypass conductor, having an electrical resistivity smaller than an electrical resistivity of the electrode sheet, disposed in contact with the electrode sheet along a surface of a portion of the electrode sheet, and electrically connected to the electrode sheet in an area in contact with the electrode sheet,
  wherein the bypass conductor has meshes and is formed in a sheet shape,
  the electrode sheet is formed in an elongated shape, the at least one terminal part is disposed in an end portion or a central portion of a longitudinal direction of the electrode sheet and protrudes in a short direction of the electrode sheet,
  an orientation direction of the meshes of the bypass conductor is inclined with respect to the longitudinal direction of the electrode sheet, and
  the bypass conductor and the at least one terminal part are placed apart from each other, the electrostatic transducer has a back surface disposed along an outer circumferential surface of the core member to face an outer circumferential surface of the core member about the centerline, wherein the back surface of the electrostatic transducer is a surface of the insulator sheet opposite to the at least one electrode sheet; and
a resin inner layer member interposed between the outer circumferential surface of the core member and the back surface of the electrostatic transducer and fixed to the core member and the electrostatic transducer,
wherein end sides of the electrostatic transducer in a circumferential direction of the outer circumferential surface of the core member is defined as first end sides,
the two first end sides of the electrostatic transducer are disposed to face each other with a distance in a circumferential direction of the outer circumferential surface of the core member, and
the resin inner layer member is interposed in a gap between the two first end sides.

2. The electrostatic transducer unit according to claim 1, wherein the electrostatic transducer has a first terminal part or a first wiring electrically connected to the first electrode sheet, and
  the first terminal part or the first wiring is disposed in a gap between the two first end sides opposite to each other.

3. The electrostatic transducer unit according to claim 1, wherein the electrostatic transducer has at least one third through-hole, passing in a thickness direction in a region in which the first electrode sheet is not disposed, and functioning as a resin injection hole or an air vent hole upon resin injection, and
  the resin inner layer member is disposed in the third through-hole.

4. The electrostatic transducer unit according to claim 3, wherein the electrostatic transducer has a first terminal part or a first wiring electrically connected to the first electrode sheet, and
  the first terminal part or the first wiring is disposed in the third through-hole.

5. The electrostatic transducer unit according to claim 1, wherein the core member has a shape in which the centerline is formed in a ring shape,
  end sides of the electrostatic transducer in the ring-shaped circumferential direction of the core member are defined as second end sides,
  the two second end sides of the electrostatic transducer are disposed to face each other with a distance in the ring-shaped circumferential direction of the core member, and
  the resin inner layer member is interposed in a gap between the two second end sides.

6. The electrostatic transducer unit according to claim 5, wherein the electrostatic transducer has a first terminal part or a first wiring electrically connected to the first electrode sheet, and
- the first terminal part or the first wiring is disposed in a gap between the two second end sides opposite to each other.

7. The electrostatic transducer unit according to claim 1, wherein the electrostatic transducer further includes a heater sheet disposed on the side of the back surface, and
- the resin inner layer member is fixed to the heater sheet.

8. The electrostatic transducer unit according to claim 1, wherein the electrode sheet is a first electrode sheet, the electrostatic transducer further comprises:
- at least one second electrode sheet laminated on another surface of the insulator sheet opposite to the first electrode sheet, constituting one target region as a detection region or a driving region, formed of an elastomer containing conductive fillers, and including at least one terminal part; and
- a second terminal part or a second wiring electrically connected to the second electrode sheet, and
- the second terminal part or the second wiring is disposed in a gap between the two first end sides opposite to each other.

* * * * *